United States Patent
Kawakami et al.

(10) Patent No.: US 8,975,978 B2
(45) Date of Patent: Mar. 10, 2015

(54) INTERCONNECT SUBSTRATE AND ELECTRONIC DEVICE

(75) Inventors: Masashi Kawakami, Tokyo (JP); Hiroshi Toyao, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 13/816,703

(22) PCT Filed: May 25, 2011

(86) PCT No.: PCT/JP2011/002924
§ 371 (c)(1),
(2), (4) Date: Feb. 12, 2013

(87) PCT Pub. No.: WO2012/029213
PCT Pub. Date: Mar. 8, 2012

(65) Prior Publication Data
US 2013/0143445 A1    Jun. 6, 2013

(30) Foreign Application Priority Data

Aug. 30, 2010    (JP) ................................. 2010-192247

(51) Int. Cl.
*H04B 3/28* (2006.01)
*H05K 1/02* (2006.01)
(Continued)

(52) U.S. Cl.
CPC ........ *H05K 5/0091* (2013.01); *H01L 23/49822* (2013.01); *H05K 1/0236* (2013.01);
(Continued)

(58) Field of Classification Search
CPC ........... H01L 23/49822; H05K 1/0216; H05K 1/0224; H05K 1/0236

USPC .................... 333/12, 236, 238, 245, 246, 247
See application file for complete search history.

(56) References Cited

U.S. PATENT DOCUMENTS 6,018,282 A * 1/2000 Tsuda ........................... 333/205
6,700,792 B1 * 3/2004 Bando et al. ................... 361/761
(Continued)

FOREIGN PATENT DOCUMENTS

JP          3697382 B      7/2005
JP      2008-227366 A     9/2008
(Continued)

OTHER PUBLICATIONS

International Search Report in PCT/JP2011/002924 dated Aug. 30, 2011 (English Translation Thereof).

*Primary Examiner* — Robert Pascal
*Assistant Examiner* — Alan Wong
(74) *Attorney, Agent, or Firm* — McGinn IP Law Group, PLLC

(57) ABSTRACT

Provided is an interconnect substrate that includes a laminated body including an electric conductor and an insulator, over which an electronic element (141) is disposed, wherein the laminated body includes a first layer (130) having at least one first conductor (131) separated in an island shape, a first connecting member (142) which is buried in the laminated body in order to electrically connect the electronic element (141) and the first conductor (131), a second layer (110) having a third conductor (111) which is provided opposite to at least a partial region of the first conductor (131), a second conductor (122) which is provided opposite to at least one of the first conductor (131) and the third conductor (111) with a layer of an insulator interposed therebetween, wherein when the laminated body is seen in a plan view, the second conductor (122) is located at a region less than a quarter of a wavelength occurring at a frequency of noise propagated from the electronic element (141) to the first conductor (131), from an end of the first conductor (131).

20 Claims, 33 Drawing Sheets

(51) Int. Cl.
  *H05K 5/00* (2006.01)
  *H01L 23/498* (2006.01)
  *H01P 1/00* (2006.01)
  *H05K 1/16* (2006.01)

(52) U.S. Cl.
  CPC ............ *H05K1/0224* (2013.01); *H05K 1/0243* (2013.01); *H05K 1/165* (2013.01); *H01L 2224/16227* (2013.01); *H01L 2224/16225* (2013.01)
  USPC ............................................ 333/12; 333/247

(56) References Cited

U.S. PATENT DOCUMENTS 7,239,222 B2 * 7/2007 Nagaishi et al. .............. 333/247
8,035,991 B2 * 10/2011 Kim et al. ...................... 361/818
2005/0029632 A1 2/2005 McKinzie, III et al.
2007/0146102 A1 6/2007 Mckinzie, III
2010/0212951 A1 8/2010 Kim et al.
2010/0265159 A1 10/2010 Ando et al.
2011/0012697 A1 1/2011 Takemura et al.

FOREIGN PATENT DOCUMENTS

| JP | 2010-199550 A | 9/2010 |
| WO | WO2005/002295 A2 | 1/2005 |
| WO | WO 2005/091941 A2 | 10/2005 |
| WO | WO2009/082003 A1 | 7/2009 |
| WO | WO2009/131140 A1 | 10/2009 |

* cited by examiner (A)

(B)

INTERCONNECT SUBSTRATE AND ELECTRONIC DEVICE

TECHNICAL FIELD

The present invention relates to an interconnect substrate and an electronic device.

BACKGROUND ART

There is a problem in that in interconnect substrates to which an electronic element is mounted, noise generated from the electronic element is electrically connected to an electronic element, flows to a plane separated in an island shape, and thus electromagnetic leakage is increased due to an operation similar to a patch antenna using the noise as a vibration source.

In addition, similarly, there is a problem in that in interconnect substrates to which an electronic element is mounted, a slit formed between a plane which is electrically connected to the electronic element and is separated in an island shape and a plane adjacent thereto uses noise, generated in the electronic element and flowing to the plane separated in an island shape, as a vibration source, and thus electromagnetic leakage is increased due to an operation similar to a slot antenna.

A technique of Patent Document 1 discloses that a high-frequency current changes to a node and a voltage changes to an antinode at the end of an insular power plane in resonance, and leakage from the end is suppressed by connecting insular power planes adjacent to each other through a capacitive member, and causing a high-frequency current to pass through the capacitive member.

A technique of Patent Document 2 discloses that electromagnetic leakage is suppressed by connecting an insular power plane and a power plane adjacent thereto through a plurality of line elements having different lengths or relative dielectric constants, and applying a power supply voltage fluctuation, causing noise leakage, to a plane which is not isolated by phase shift from an isolated power plane.

RELATED DOCUMENT

Patent Document

[Patent Document 1] Specification of Japanese Patent No. 3697382

[Patent Document 2] Japanese Unexamined Patent Publication No. 2008-227366

DISCLOSURE OF THE INVENTION

However, though it is assumed that a bypass capacitor is used as a component in the technique disclosed in Patent Document 1, and a line element (LILC) is used as a component in the technique disclosed in Patent Document 2, these components are required to be mounted and thus it is necessary to provide dedicated pads. For this reason, in the techniques Patent Documents 1 and 2, restrictions are laid on circuit designs. In addition, the techniques disclosed in Patent Documents 1 and 2 in which the component as mentioned above are used have little effect on high-frequency noise of 1 GHz or more.

Consequently, an object of the invention is to provide a unit that suppresses electromagnetic leakage from a plane separated in an island shape or a slit adjacent to the plane, the unit in which a dedicated pad is not required to be provided, and which is effective against high-frequency noise of 1 GHz or more.

According to the invention, there is provided an interconnect substrate including a laminated body, including an electric conductor and an insulator, over which an electronic element is disposed, wherein the laminated body includes a first layer having at least one first conductor separated in an island shape, a first connecting member which is buried in the laminated body in order to electrically connect the electronic element and the first conductor, a second layer having a third conductor which is provided opposite to at least a partial region of the first conductor, and a second conductor which is provided opposite to at least one of the first conductor and the third conductor with a layer of the insulator interposed therebetween, and wherein when the laminated body is seen in a plan view, the second conductor is located at a region less than a quarter of a wavelength occurring at a frequency of noise propagated from the electronic element to the first conductor, from an end of the first conductor.

In addition, according to the invention, there is provided an electronic device including: the interconnect substrate; and an electronic element, disposed over the laminated body of the interconnect substrate, which is electrically connected to the first conductor through the first connecting member.

According to the invention, it is possible to realize a unit that suppresses electromagnetic leakage from a plane separated in an island shape or a slit adjacent to the plane, the unit in which a dedicated pad is not required to be provided, and which is effective against high-frequency noise of 1 GHz or more.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Figure 1:
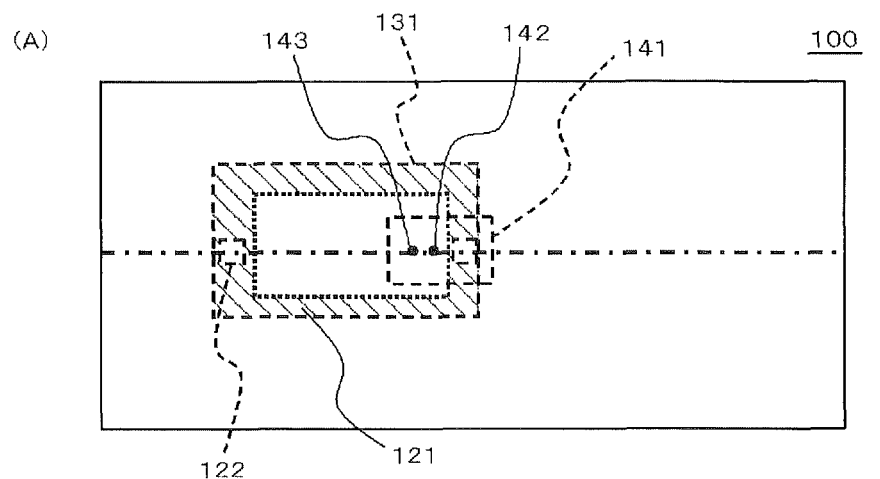
FIG. 1 is an example illustrating a top view and a cross-sectional view of an interconnect substrate according to a first embodiment of the invention.
Figure 1:
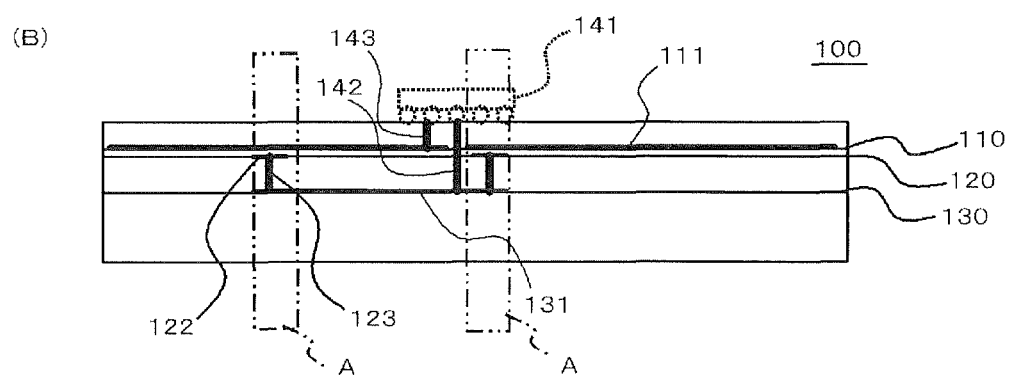

Hereinafter, the embodiments of the invention will be described with reference to the accompanying drawings. In all the drawings, like elements are referenced by like reference numerals and signs and descriptions thereof will not be repeated.

First Embodiment

FIGS. 1(A) and 1(B) are an example illustrating a top view and a cross-sectional view of an interconnect substrate 100 according to a first embodiment of the invention. More specifically, FIG. 1(A) is a top view of the interconnect substrate 100, and FIG. 1(B) is a cross-sectional view of the interconnect substrate 100 in the long-dashed short-dashed line shown in FIG. 1(A).

The interconnect substrate 100 shown in FIGS. 1(A) and 1(B) is a multilayer substrate including at least an A layer 110, a B layer 120, and a C layer 130 which are opposite to each other. The A layer 110 has a second plane 111. The B layer 120 has a conductor element 122. The C layer 130 has a first plane 131. The conductor element 122 and the first plane 131 are electrically connected to each other through a connecting member 123. Meanwhile, the interconnect substrate 100 may include layers other than the above-mentioned three layers. For example, an insulating layer may be located between each of the layers. Furthermore, a signal line layer in which only a signal line is buried in an insulating layer may be located between each of the layers.

In addition, the interconnect substrate 100 may include a hole, a via and the like, which are not shown, in the range consistent with the configuration of the invention. Further, in any one or more layers of the A layer 110, the B layer 120, and the C layer 130, a signal line may be arranged in the range consistent with the configuration of the invention.

Meanwhile, in FIGS. 1(A) and 1(B), an electronic element 141 is shown by the broken line. This means that the electronic element 141 is not mounted. That is, a region intended to mount the electronic element 141 is determined on the surface of the interconnect substrate 100. The interconnect substrate 100 includes a connecting member 142 that electrically connects the electronic element 141 and the first plane 131 which is located on the C layer 130. Further, the interconnect substrate 100 includes a connecting member 143 that electrically connects the electronic element 141 and the second plane 111 which is located on the A layer 110.

In addition to these connecting members, the interconnect substrate 100 may include a connecting member that electrically connects the electronic element 141 and a plane or a line. For example, the member is a connecting member or the like for electrical connection to a signal line or the like. Here, the electronic element 141 is assumed to be a device such as an LSI. The number of electronic elements 141 mounted to the interconnect substrate 100 may be one, or may be two or more.

Figure 2:
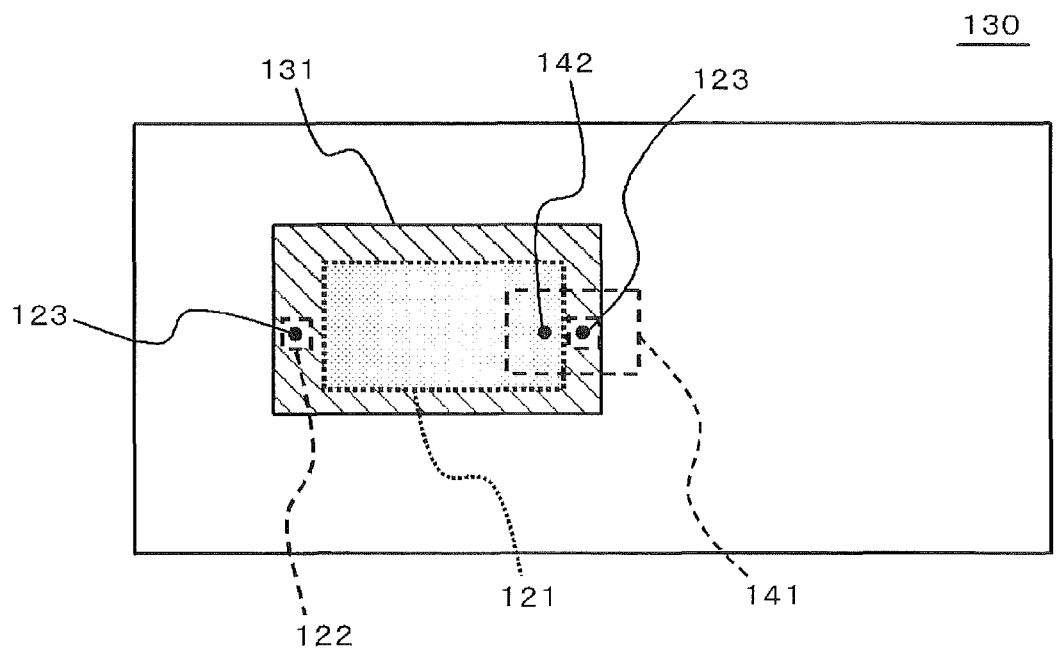
FIG. 2 is a diagram illustrating an example of a C layer of the first embodiment.

FIG. 2 is a plan view illustrating the C layer 130 of the interconnect substrate 100 shown in FIGS. 1(A) and 1(B). The C layer 130 (first layer) has the first plane 131 (first conductor), separated in an island shape, which is formed of a conductive material.

The first plane 131 has a connection point electrically connecting the connecting member 142 and the connecting member 123. The first plane 131 is a power plane or a ground plane. Meanwhile, the shape, the size and the like of the first plane 131 are not particularly limited, but can be variously set according to the related art. A region in the C layer 130 in which the first plane 131 is not formed may be an insulator, may be a conductor, and may be a mixture thereof.

Figure 3:
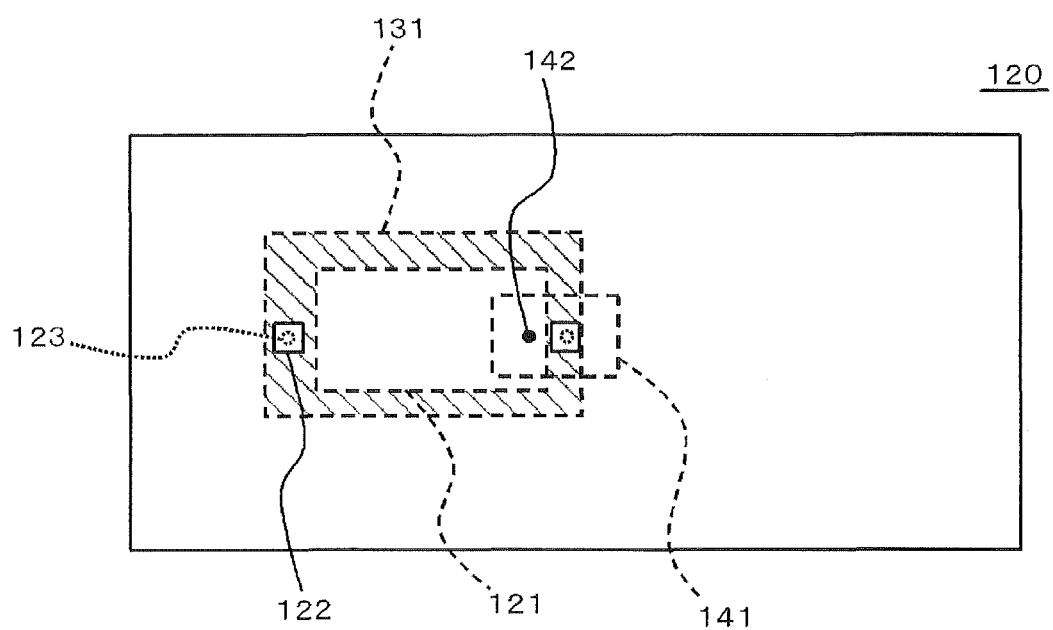
FIG. 3 is a diagram illustrating an example of a B layer of the first embodiment.

FIG. 3 is a plan view illustrating the B layer 120 of the interconnect substrate 100 shown in FIGS. 1(A) and 1(B). The B layer 120 is located between the C layer 130 and the A layer 110. On such a B layer 120, at least one or more conductor elements 122 (second conductor) are disposed in a conductor element disposition region 121 (first region, or region shown by the hatching in the drawing) which is a region less than a quarter of the wavelength at a frequency of noise desired to be suppressed, from a position opposite to the end of the first plane 131. The conductor element disposition region 121 is a region that satisfies the above condition, and may be a region opposite to the first plane 131. The "noise desired to be suppressed" is, for example, noise propagated from the electronic element 141 through the connecting member 142 to the first plane 131.

Meanwhile, the wording "the conductor element 122 is disposed in the conductor element disposition region 121" means that at least a portion of the conductor element 122 is located in the conductor element disposition region 121, but it is preferable that the entirety of the conductor element 122 be located in the conductor element disposition region 121. The premise is the same in the following all of the embodiments.

Here, a region A surrounded by the dashed-two dotted line is shown in FIG. 1(B). When the interconnect substrate 100 is seen in a plan view, the region A shows a region less than a quarter of the wavelength at a frequency of the noise desired to be suppressed from a position opposite to the end of the first plane 131, and a region opposite to the first plane 131. The premise is the same in the following all of the embodiments. In FIG. 1(B), the conductor element 122 is disposed in the region A.

Here, the conductor element 122 is an insular conductor. The planar shape of the conductor element 122 is not particularly limited, but the conductor element may be formed in a triangular shape, a pentagonal shape, and other polygonal shapes, in addition to a quadrangular shape shown, and may be formed in a circular shape, an elliptical shape and the like. In addition, the number of conductor elements 122 is not particularly limited, but a plurality of conductor elements may be provided. Meanwhile, a plurality of conductor elements are provided, the conductor elements 122 may be repeatedly, for example, periodically arranged at a predetermined distance. A region in the B layer 120 in which the conductor element 122 is not arranged is formed of an insulator, and is insulated from the connecting member 142.

The conductor element 122 is electrically connected to the first plane 131 through the connecting member 123. When the interconnect substrate 100 is seen in a plan view, the connecting member 123 is disposed in a region less than a quarter of the wavelength at a frequency of the noise desired to be suppressed from a position opposite to the end of the first plane 131, for example, a region that satisfies the above condition, and a region opposite to the first plane 131. In FIG. 1(B), the connecting member 123 is disposed within the region A. Here, the wording "when the interconnect substrate 100 is seen in a plan view, the connecting member 123 is disposed in a region less than a quarter of the wavelength at a frequency of the noise desired to be suppressed from at a position opposite to the end of the first plane 131" means that the entirety of the connecting member 123 is located in the above-mentioned region. The premise is the same in the following all of the embodiments.

Meanwhile, here, although a configuration is described in which the connecting member 123 electrically connects the first plane 131 and the conductor element 122, a configuration is also present in which the connecting member 123 does not electrically connect the first plane 131 and the conductor element 122, but electrically connects the second plane 111 and the conductor element 122. In addition, a configuration is also present in which the connecting member 123 is not provided. Such configurations will be described later.

Figure 4:
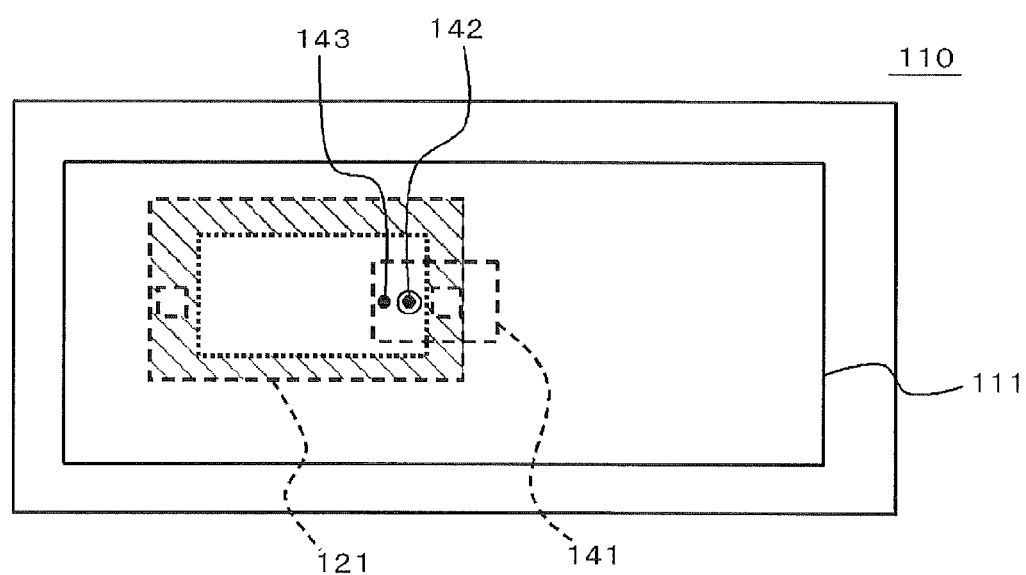
FIG. 4 is a diagram illustrating an example of an A layer of the first embodiment.
Figure 5:
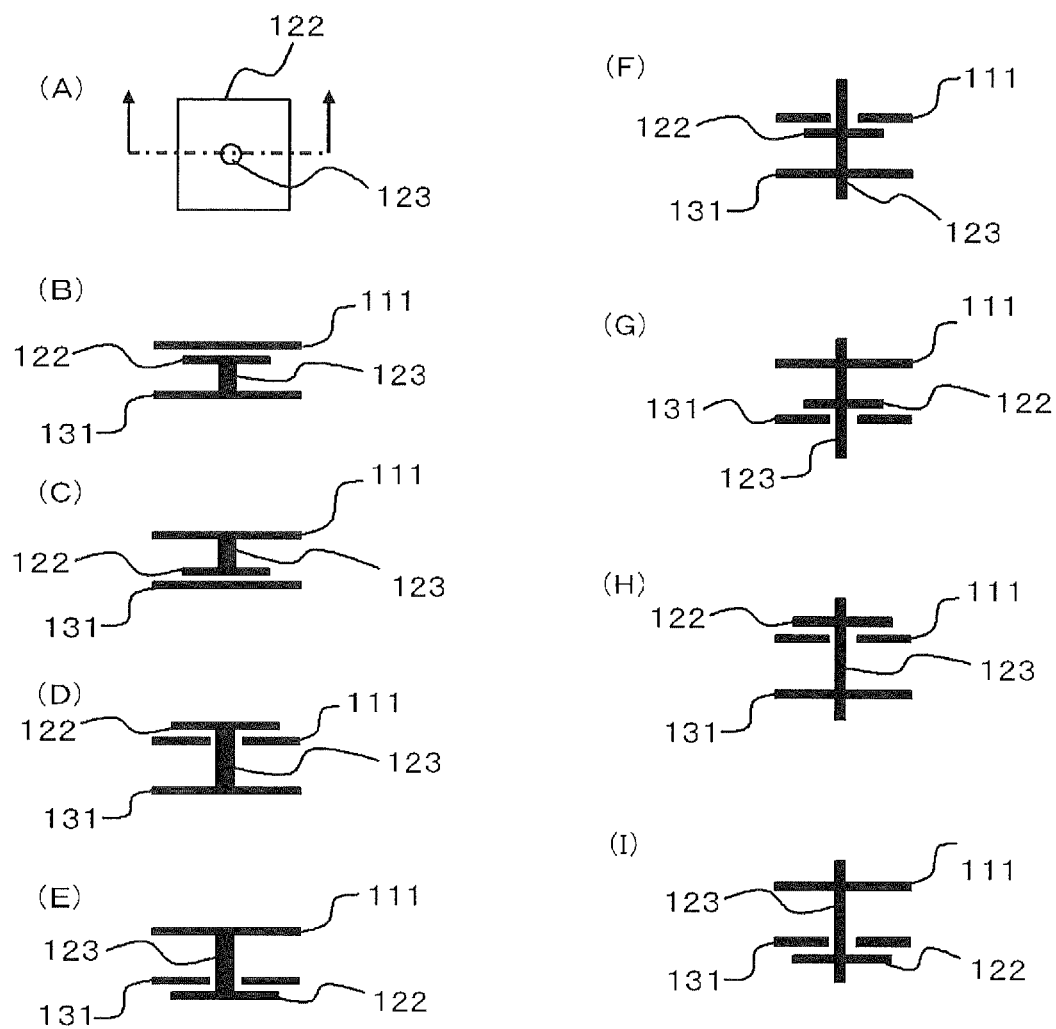
FIG. 5 is a diagram illustrating shapes and positions of a conductor element, a first conductor, a second conductor and a connecting member which are used in the first embodiment.

FIG. 4 is a plan view illustrating the A layer 110 of the interconnect substrate 100 shown in FIGS. 1(A) and 1(B). The second plane 111 (third conductor) is a sheet-like conductor, is located on the A layer 110 (second layer) which is a layer located above the C layer 130, and extends to a region opposite to the conductor element disposition region 121. That is, the second plane 111 and the conductor element 122 are opposite to each other through an insulator layer.

The second plane 111 is a power plane or aground plane. That is, when the first plane 131 is a power plane, the second plane 111 is a ground plane. When the first plane 131 is a ground plane, the second plane 111 is a power plane.

The connecting member 142 passes through an opening provided in the second plane 111 in a state of non-contact with the second plane 111, and electrically connects the electronic element 141 and the first plane 131. That is, the connecting member 142 is insulated from the second plane 111.

Meanwhile, a region in the A layer 110 in which the second plane 111 is not formed may be an insulator, may be a conductor, and may be a mixture thereof.

Here, in the interconnect substrate 100 of the embodiment, a problem can occur in that noise propagated from the electronic element 141 through the connecting member 142 to the first plane 131 leaks to space by the first plane 131 operating similarly to a patch antenna.

However, the interconnect substrate 100 of the embodiment is configured to be capable of solving the above-mentioned problem.

That is, in the interconnect substrate 100 of the embodiment, the above-mentioned configuration is adopted, and thus a unit cell of an EBG structure is formed by the conductor element 122, the first plane 131, the second plane 111, and the connecting member 123. It is possible to suppress noise propagated by the above-mentioned first plane 131 operating similarly to a patch antenna, using the EBG structure in which at least one of the unit cells is present.

Meanwhile, in each of the above-mentioned EBG structures, the frequency of noise generated by the electronic element 141 is preferably included in a band gap zone. In addition, the unit cell of the EBG structure formed by the interconnect substrate 100 of the embodiment has a structure including the connecting member 123, but is not necessarily limited thereto. That is, in the interconnect substrate 100, a connecting member may not necessarily be formed in an intermediate layer between the first plane 131 and the second plane 111. The unit cells of various EBG structures which are capable of being applied to the interconnect substrate 100 will be described later.

The term "unit cell" herein means a minimum unit forming an EBG structure. The interconnect substrate 100 includes at least one unit cell in the conductor element disposition region 121, so that noise leakage is suppressed by preventing the end of the first plane 131 from having a node of a high-frequency current and an antinode of a voltage and preventing the end thereof from operating similarly to a patch antenna.

Meanwhile, it is possible to set a desired band gap zone by adjusting the distance between the conductor element 122 and the first plane 131, the distance between the conductor element 122 and the second plane 111, the thickness of the connecting member 123, the mutual distance between the conductor elements 122, and the like.

Here, the shapes and the positions of the conductor element 122, the connecting member 123, the first plane 131, and the second plane 111 which are shown in FIGS. 1 to 4 are just an example, and it is possible to adopt various configurations in a range in which an EBG structure can be formed.

FIGS. 5 to 11 are diagrams illustrating shapes and positions of the conductor element 122, the connecting member 123, the first plane 131, and the second plane 111. Meanwhile, FIGS. 5 to 11 are enlarged views illustrating the periphery of the single conductor element 122. Each of the structures illustrated in FIGS. 5 to 11 forms a single or a plurality of unit cells, and the interconnect substrate 100 includes any of these unit cells or a plurality of combinations thereof.

FIG. 5(A) is a top view illustrating an example of the conductor element 122. The conductor element 122 shown herein is quadrangular, and is electrically connected to the connecting member 123. FIGS. 5(B) to 5(I) are cross-sectional views illustrating chief parts of the interconnect substrate 100 including the conductor element 122 shown in FIG. 5(A).

In FIG. 5(B), the connecting member 123 electrically connected to the conductor element 122 is electrically connected to the first plane 131, and has the same configuration as described with reference to FIGS. 1 to 4. In FIG. 5(C), the connecting member 123 electrically connected to the conductor element 122 is electrically connected to the second plane 111.

In FIG. 5(D), the B layer 120 on which the conductor element 122 is formed is opposite to the C layer 130 (first layer) on which the first plane 131 is formed, through the A layer 110 (second layer) on which the second plane 111 is formed. The connecting member 123 is electrically connected to the first plane 131, and passes through an opening provided in the second plane 111 in a state of non-contact with the second plane 111. The conductor element 122 is opposite to the second plane 111, and is electrically connected to the connecting member 123 passing through the opening provided in the second plane 111. The connecting member 123 passes through the inside of the opening provided in the second plane 111 described herein, and the conductor element 122 is disposed so as to be opposite to the opening. Therefore, it is possible to substantially prevent noise from leaking from the opening.

In FIG. 5(E), the B layer 120 on which the conductor element 122 is formed is opposite to the A layer 110 (second layer) on which the second plane 111 is formed, through the C layer 130 (first layer) on which the first plane 131 is formed. The connecting member 123 is electrically connected to the second plane 111, and passes through an opening provided in the first plane 131 in a state of non-contact with the first plane 131. The conductor element 122 is opposite to the first plane 131, and is electrically connected to the connecting member 123 passing through the opening provided in the first plane 131. The connecting member 123 passes through the inside of the opening provided in the first plane 131 described herein, and the conductor element 122 is disposed so as to be opposite to the opening. Therefore, it is possible to substantially prevent noise from leaking from the opening.

Each of the structures of FIGS. 5(B) to 5(E) mentioned above is a so-called mushroom-type EBG structure.

Specifically, the connecting member 123 is equivalent to a shank of a mushroom, and forms an inductance. On the other hand, in FIGS. 5(B) and 5(D), the conductor element 122 is equivalent to a head portion of the mushroom, and forms a capacitance between the conductor element and the second plane 111 opposite thereto. In addition, in FIGS. 5(C) and 5(E), the conductor element 122 is equivalent to the head portion of the mushroom, and forms a capacitance between the conductor element and the first plane 131 opposite thereto.

The mushroom-type EBG structure can be represented by an equivalent circuit in which a parallel plate is shunted using a series resonant circuit formed of the above-mentioned capacitance and the above-mentioned inductance, the resonance frequency of the above-mentioned series resonant circuit provides a center frequency of the band gap. Therefore, the band gap zone can be shifted to a lower frequency by bringing the above-mentioned conductor element 122 close to each of the opposite planes forming a capacitance to increase the capacitance. However, even when the above-mentioned conductor element 122 is not brought close to the opposite plane, the essential effect of the invention is not influenced at all.

FIGS. 5(F) to 5(I) are an example in which the connecting member 123 is a through via.

In FIG. 5(F), the through via (connecting member 123) electrically connected to the conductor element 122 is electrically connected to the first plane 131, and passes through the opening of the second plane 111 in a state of non-contact with the second plane 111. That is, the through via (connecting member 123) and the second plane 111 are insulated from each other. In FIG. 5(G), the through via (connecting member 123) electrically connected to the conductor element 122 is electrically connected to the second plane 111, and passes through the opening of the first plane 131 in a state of non-contact with the first plane 131. That is, the through via (connecting member 123) and the first plane 131 are insulated from each other.

In FIG. 5(H), the B layer 120 on which the conductor element 122 is formed is opposite to the C layer 130 (first layer) on which the first plane 131 is formed, through the A layer 110 (second layer) on which the second plane 111 is formed. The through via (connecting member 123) is electrically connected to the first plane 131, and passes through the opening provided in the second plane 111 in a state of non-contact with the second plane 111. The conductor element 122 is opposite to the second plane 111, and is electrically connected to the through via (connecting member 123) passing through the opening provided in the second plane 111.

In FIG. 5(I), the B layer 120 on which the conductor element 122 is formed is opposite to the A layer 110 (second layer) on which the second plane 111 is formed, through the C layer 130 (first layer) on which the first plane 131 is formed. The through via (connecting member 123) is electrically connected to the second plane 111, and passes through the opening provided in the first plane 131 in a state of non-contact with the first plane 131. The conductor element 122 is opposite to the first plane 131, and is electrically connected to the through via (connecting member 123) passing through the opening provided in the first plane 131.

The structures of FIGS. 5(F) to 5(I) mentioned above are an example in which the mushroom-type EBG structure is deformed. Specifically, the connecting member 123 is equivalent to a shank of a mushroom, and forms an inductance. On the other hand, in FIGS. 5(F) and 5(H), the conductor element 122 is equivalent to ahead portion of the mushroom, and forms a capacitance between the conductor element and the second plane 111 opposite thereto. In addition, in FIGS. 5(G) and 5(I), the conductor element 122 is equivalent to a head portion of the mushroom, and forms a capacitance between the conductor element and the first plane 131 opposite thereto.

Similarly to the mushroom-type EBG structure, each of the structures of FIGS. 5(F) to 5(I) can also be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the above-mentioned conductor element 122 close to each of the opposite planes forming a capacitance to increase the capacitance. However, even when the conductor element 122 is not brought close to the opposite plane, the essential effect of the invention is not influenced at all.

The configurations shown in FIGS. 5(F) to 5(I) are adopted, thereby allowing an EBG structure to be manufactured in the conductor element disposition region 121 using a through via. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used.

FIG. 6(A) is a top view illustrating an example of the conductor element 122. The conductor element 122 shown herein is a spiral transmission line formed in the planar direction, and is configured such that one end thereof is connected to the connecting member 123, and the other end thereof is formed as an open end. FIGS. 6(B) to 6(I) are cross-sectional views illustrating chief parts of the interconnect substrate 100 including the conductor element 122 shown in FIG. 6(A).

In FIG. 6(B), the connecting member 123 electrically connected to the conductor element 122 is electrically connected to the first plane 131. In FIG. 6(C), the connecting member 123 electrically connected to the conductor element 122 is electrically connected to the second plane 111.

In FIG. 6(D), the B layer 120 on which the conductor element 122 is formed is opposite to the C layer 130 (first layer) on which the first plane 131 is formed, through the A layer 110 (second layer) on which the second plane 111 is formed. The connecting member 123 is electrically connected to the first plane 131, and passes through the opening provided in the second plane 111 in a state of non-contact with the second plane 711. The conductor element 122 is opposite to the second plane 111, and is electrically connected to the connecting member 123 passing through the opening provided in the second plane 111. The connecting member 123 passes through the inside of the opening provided in the second plane 111 described herein, and the conductor element 122 is disposed so as to be opposite to the opening. Therefore, it is possible to substantially prevent noise from leaking from the opening.

In FIG. 6(E), the B layer 120 on which the conductor element 122 is formed is opposite to the A layer 110 (second layer) on which the second plane 111 is formed, through the C layer 130 (first layer) on which the first plane 131 is formed. The connecting member 123 is electrically connected to the second plane 111, and passes through the opening provided in the first plane 131 in a state of non-contact with the first plane 131. The conductor element 122 is opposite to the first plane 131, and is electrically connected to the connecting member 123 passing through the opening provided in the first plane 131. The connecting member 123 passes through the inside of the opening provided in the first plane 131 described herein, and the conductor element 122 is disposed so as to be opposite to the opening. Therefore, it is possible to substantially prevent noise from leaking from the opening.

Each of the structures shown in FIGS. 6(B) to 6(E) is an open stub-type EBG structure in which a microstrip line formed including the conductor element 122 functions as an open stub. Specifically, the connecting member 123 forms an inductance. In FIGS. 6(B) and 6(D), the conductor element 122 is electrically coupled to the second plane 111 opposite thereto, to thereby form a microstrip line using the second plane 111 as a return path. In addition, in FIGS. 6(C) and 6(E), the conductor element 122 is electrically coupled to the opposite first plane 131, to form a microstrip line using the first plane 131 as a return path.

The open stub-type EBG structure can be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the above-mentioned conductor element 122.

In addition, it is preferable that the conductor element 122 forming a microstrip line and the plane (111 or 131) opposite thereto be close to each other. This is because as the distance between the conductor element 122 and the opposite plane decreases, the characteristic impedance of the above-mentioned microstrip line becomes lower, and thus the band gap zone can be widened. However, even when the conductor element 122 is not brought close to the opposite plane, the essential effect of the invention is not influenced at all.

FIGS. 6(F) to 6(I) are an example in which the connecting member 123 is a through via.

In FIG. 6(F), the through via (connecting member 123) electrically connected to the conductor element 122 is electrically connected to the first plane 131, and passes through the opening of the second plane 111 in a state of non-contact with the second plane 111. That is, the through via (connecting member 123) and the second plane 111 are insulated from each other. In FIG. 6(G), the through via (connecting member 123) electrically connected to the conductor element 122 is electrically connected to the second plane 111, and passes through the opening of the first plane 131 in a state of non-contact with the first plane 131. That is, the through via (connecting member 123) and the first plane 131 are insulated from each other.

In FIG. 6(H), the B layer 120 on which the conductor element 122 is formed is opposite to the C layer 130 (first layer) on which the first plane 131 is formed, through the A layer 110 (second layer) on which the second plane 111 is formed. The through via (connecting member 123) is electrically connected to the first plane 131, and passes through the opening provided in the second plane 111 in a state of non-contact with the second plane 111. The conductor element 122 is opposite to the second plane 111, and is electrically connected to the through via (connecting member 123) passing through the opening provided in the second plane 111.

In FIG. 6(I), the B layer 120 on which the conductor element 122 is formed is opposite to the A layer 110 (second layer) on which the second plane 111 is formed, through the C layer 130 (first layer) on which the first plane 131 is formed. The through via (connecting member 123) is electrically connected to the second plane 111, and passes through the opening provided in the first plane 131 in a state of non-contact with the first plane 131. The conductor element 122 is opposite to the first plane 131, is electrically connected to the through via (connecting member 123) passing through the opening provided in the first plane 131.

Each of the structures shown in FIGS. 6(F) to 6(I) is a modified example of the open stub-type EBG structure in which a microstrip line formed including the conductor element 122 functions as an open stub. Specifically, the connecting member 123 forms an inductance. In FIGS. 6(F) and 6(H), the conductor element 122 is electrically coupled to the opposite second plane 111, to form a microstrip line using the second plane 111 as a return path. In addition, in FIGS. 6(G) and 6(I), the conductor element 122 is electrically coupled to the opposite first plane 131, to thereby form a microstrip line using the first plane 131 as a return path. One end of the above-mentioned microstrip line is formed as an open end, and functions as an open stub.

Similarly to the open stub-type EBG structure, each of the structures shown in FIGS. 6(F) to 6(I) can also be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the above-mentioned conductor element 122.

In addition, it is preferable that the conductor element 122 forming a microstrip line and the plane (111 or 131) opposite thereto be close to each other. This is because as the distance between the conductor element 122 and the opposite plane decreases, the characteristic impedance of the above-mentioned microstrip line becomes lower, and thus the band gap zone can be widened. However, even when the conductor element 122 is not brought close to the opposite plane, the essential effect of the invention is not influenced at all.

The configurations shown in FIGS. 6(F) to 6(I) are adopted, thereby allowing an EBG structure to be manufactured in the first and second parallel plates using a through via as the connecting member 123. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used.

Figure 6:
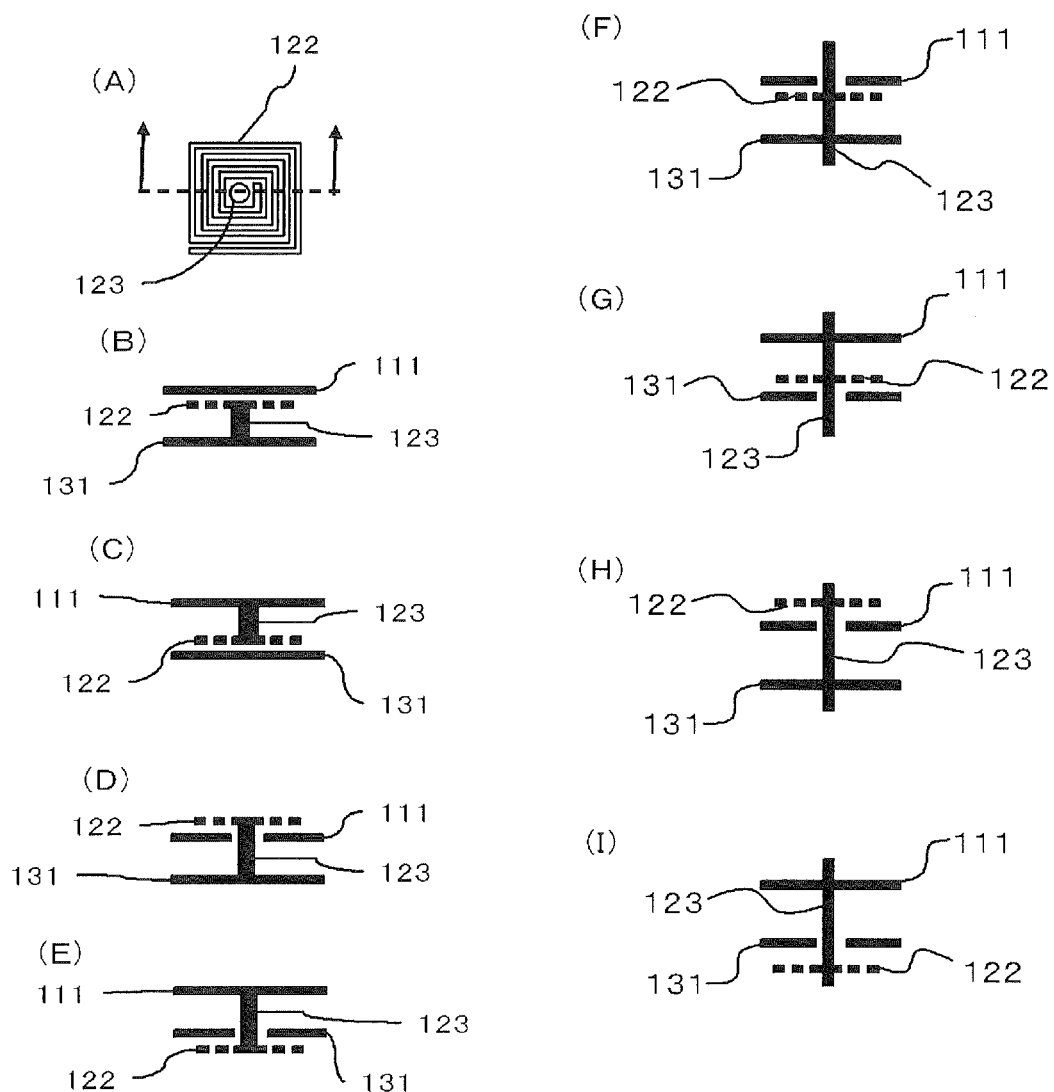
FIG. 6 is a diagram illustrating shapes and positions of the conductor element, the first conductor, the second conductor and the connecting member which are used in the first embodiment.

Meanwhile, in FIG. 6, the above-mentioned transmission line is spiral in shape, but the shape thereof may not be limited thereto. For example, the transmission line may be linear in shape, and may be meandering in shape.

FIG. 7(A) is a top view illustrating an example of the conductor element 122. The conductor element 122 shown herein is a quadrangular conductor, and has an opening. A spiral inductor of which one end is electrically connected to the conductor element 122 in a deep spot of the opening and the other end is connected to the connecting member 123 is formed in the inside of the opening. FIGS. 7(B) to 7(I) are cross-sectional views illustrating chief parts of the interconnect substrate 100 including the conductor element 122 shown in FIG. 7(A).

In FIG. 7(B), the connecting member 123 electrically connected to the conductor element 122 is electrically connected to the first plane 131. In FIG. 7(C), the connecting member 123 electrically connected to the conductor element 122 is electrically connected to the second plane 111.

In FIG. 7(D), the B layer 120 on which the conductor element 122 is formed is opposite to the C layer 130 (first layer) on which the first plane 131 is formed, through the A layer 110 (second layer) on which the second plane 111 is formed. The connecting member 123 is electrically connected to the first plane 131, and passes through the opening provided in the second plane 111 in a state of non-contact with the second plane 111. The conductor element 122 is opposite to the second plane 111, and is electrically connected to the connecting member 123 passing through the opening provided in the second plane 111. The connecting member 123 passes through the inside of the opening provided in the second plane 111 described herein, and the conductor element 122 is disposed so as to be opposite to the opening. Therefore, it is possible to substantially prevent noise from leaking from the opening.

In FIG. 7(E), the B layer 120 on which the conductor element 122 is formed is opposite to the A layer 110 (second layer) on which the second plane 111 is formed, through the C layer 130 (first layer) on which the first plane 131 is formed. The connecting member 123 is electrically connected to the second plane 111, and passes through the opening provided in the first plane 131 in a state of non-contact with the first plane 131. The conductor element 122 is opposite to the first plane 131, and is electrically connected to the connecting member 123 passing through the opening provided in the first plane 131. The connecting member 123 passes through the inside of the opening provided in the first plane 131 described herein, and the conductor element 122 is disposed so as to be opposite to the opening. Therefore, it is possible to substantially prevent noise from leaking from the opening.

Each of the structures of FIGS. 7(B) to 7(E) mentioned above is an increased inductance-type EBG structure in which the inductance is increased by providing an inductor in a head portion of a mushroom, on a mushroom-type EBG structure basis. Specifically, in FIGS. 7(B) and 7(D), the conductor element 122 is equivalent to the head portion of the mushroom, and forms a capacitance between the conductor element and the second plane 111 opposite thereto. In FIGS. 7(C) and 7(E), the conductor element 122 is equivalent to the head portion of the mushroom, and forms a capacitance between the conductor element and the first plane 131 opposite thereto. The connecting member 123 is equivalent to a shank of the mushroom, and forms an inductance together with the inductor provided in the conductor element 122.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor element 122 close to each of the opposite planes forming a capacitance to increase the capacitance or by increasing the length of the above-mentioned inductor to increase the inductance. However, even when the conductor element 122 is not brought close to the opposite plane, the essential effect of the invention is not influenced at all.

FIGS. 7(F) to 7(I) are an example in which the connecting member 123 is a through via.

In FIG. 7(F), the through via (connecting member 123) electrically connected to the conductor element 122 is electrically connected to the first plane 131, and passes through the opening of the second plane 111 in a state of non-contact with the second plane 111. That is, the through via (connecting member 123) and the second plane 111 are insulated from each other. In FIG. 7(G), the through via (connecting member 123) electrically connected to the conductor element 122 is electrically connected to the second plane 111, and passes through the opening of the first plane 131 in a state of non-contact with the first plane 131. That is, the through via (connecting member 123) and the first plane 131 are insulated from each other.

In FIG. 7(H), the B layer 120 on which the conductor element 122 is formed is opposite to the C layer 130 (first layer) on which the first plane 131 is formed, through the A layer 110 (second layer) on which the second plane 111 is formed. The through via (connecting member 123) is electrically connected to the first plane 131, and passes through the opening provided in the second plane 111 in a state of non-contact with the second plane 111. The conductor element 122 is opposite to the second plane 111, and is electrically connected to the through via (connecting member 123) passing through the opening provided in the second plane 111.

FIG. 7(I), the B layer 120 on which the conductor element 122 is formed is opposite to the A layer 110 (second layer) on which the second plane 111 is formed, through the C layer 130 (first layer) on which the first plane 131 is formed. The through via (connecting member 123) is electrically connected to the second plane 111, and passes through the opening provided in the first plane 131 in a state of non-contact with the first plane 131. The conductor element 122 is opposite to the first plane 131, and is electrically connected to the through via (connecting member 123) passing through the opening provided in the first plane 131.

Each of the structures of FIGS. 7(F) to 7(I) mentioned above is a modified example of the increased inductance-type EBG structure in which the inductance is increase by providing an inductor in a head portion of a mushroom. Specifically, the connecting member 123 is equivalent to a shank of the mushroom, and forms an inductance. In FIGS. 7(F) and 7(H), the conductor element 122 is equivalent to the head portion of the mushroom, and forms a capacitance between the conductor element and the second plane 111 opposite thereto. In FIGS. 7(G) and 7(I), the conductor element 122 is equivalent to the head portion of the mushroom, and forms a capacitance between the conductor element and the first plane 131 opposite thereto.

Similarly to the mushroom-type EBG structure, each of the structures of FIGS. 7(F) to 7(I) can also be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor element 122 close to each of the opposite planes forming a capacitance to increase the capacitance or by increasing the length of the above-mentioned inductor to increase the inductance. However, even when the conductor element 122 is not brought close to the opposite plane, the essential effect of the invention is not influenced at all.

The configurations shown in FIGS. 7(F) to 7(I) are adopted, thereby allowing an EBG structure to be manufactured in the first and second parallel plates using a through via. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used.

Figure 7:
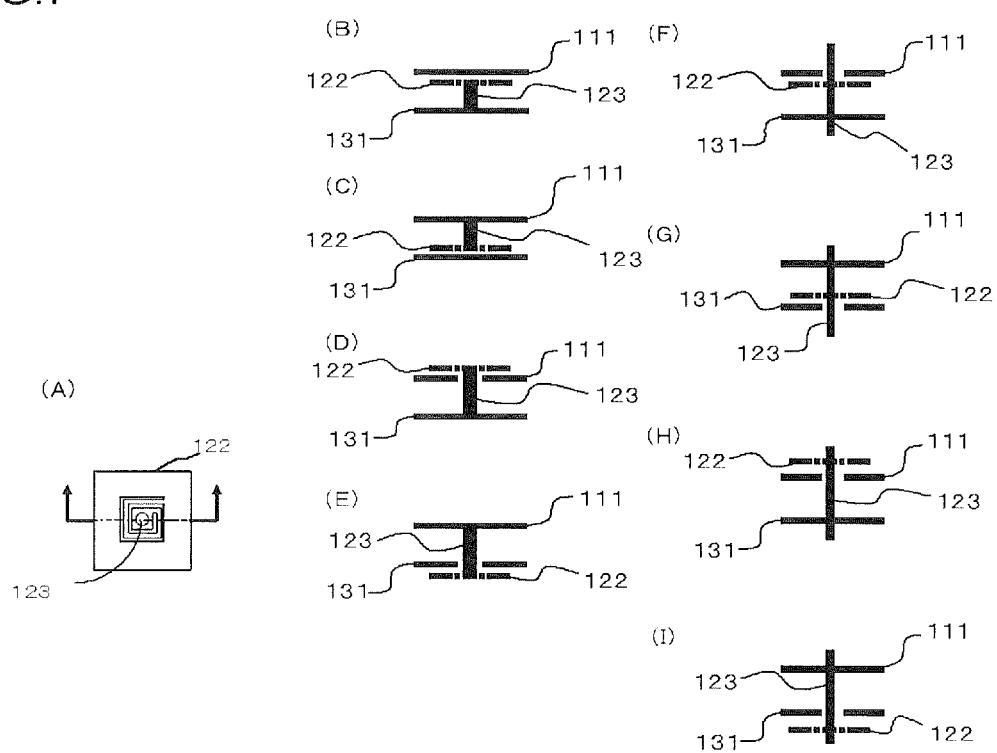
FIG. 7 is a diagram illustrating shapes and positions of the conductor element, the first conductor, the second conductor and the connecting member which are used in the first embodiment.
Figure 8:
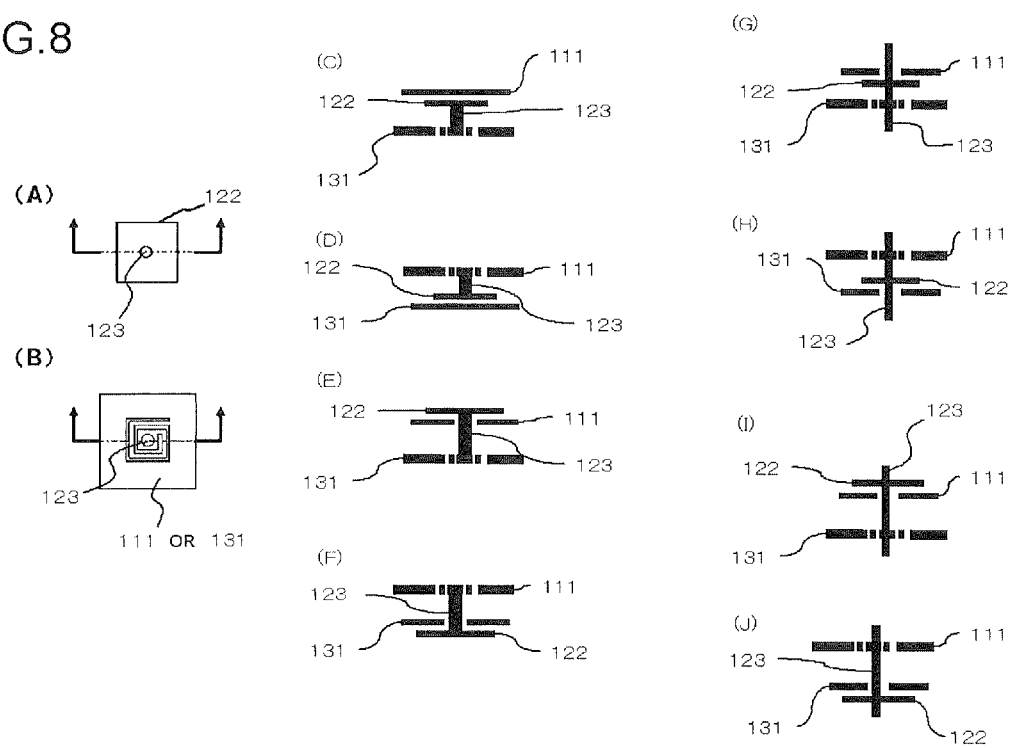
FIG. 8 is a diagram illustrating shapes and positions of the conductor element, the first conductor, the second conductor and the connecting member which are used in the first embodiment.

Meanwhile, in FIG. 7, the above-mentioned inductor is spiral in shape, but the shape thereof may not be limited thereto. For example, the inductor may be linear in shape, and may be meandering in shape.

When the examples shown in FIGS. 5(B) and 5(C), FIGS. 6(B) and 6(C), and FIGS. 7(B) and 7(C) are used, an opening through which the connecting member 123 passes is not required to be provided in the second plane 111 and the first plane 131. Meanwhile, when regions opposite to the conductor element 122 are formed to be imperforate in the second plane 111 and the first plane 131, it is preferable because noise does not leak from the regions. Here, even when a hole (opening) having a diameter sufficiently smaller than the noise wavelength of a frequency band to be suppressed is empty in the region opposite to the conductor element 122, the hole may be deemed to be imperforate.

In addition, when the examples shown in FIGS. 5(D) to 5(I), FIGS. 6(D) to 6(I), and FIGS. 7(D) to 7(I) are used, the first plane 131 or the second plane 111 has an opening through which the connecting member 123 passes. However, when the opening has a diameter sufficiently smaller than the noise wavelength of a frequency band to be suppressed, noise to be suppressed does not leak, and thus it is preferable to form the opening in this manner.

FIG. 8(A) is a top view illustrating an example of the conductor element 122. The conductor element 122 shown herein is quadrangular, and is electrically connected to the connecting member 123. In addition, FIG. 8(B) is atop view illustrating a portion of an example (region opposite to the conductor element 122) of the first plane 131 or the second plane 111 which is electrically connected to the conductor element 122 through the connecting member 123. The first plane 131 or the second plane 111 shown in FIG. 8(B) has an opening, and a spiral inductor of which one end is electrically connected to the first plane 131 or the second plane 111 in a deep spot of the opening and the other end is electrically connected to the connecting member 123 is formed in the inside of the opening. FIGS. 8(C) to 8(J) are cross-sectional views illustrating chief parts of the interconnect substrate 100 including the conductor element 122, and the first plane 131 or the second plane 111 shown in FIGS. 8(A) and 8(B).

In FIGS. 8(C) and 8(E), the connecting member 123 electrically connected to the conductor element 122 is electrically connected to an inductor formed in the opening of the first plane 131. On the other hand, in FIGS. 8(D) and 8(F), the connecting member 123 electrically connected to the conductor element 122 is electrically connected to an inductor formed in the opening of the second plane 111. Meanwhile, in FIG. 8(E), the connecting member 123 passes through the opening of the second plane 111 in a state of non-contact with the second plane 111. That is, the connecting member 123 and the second plane 111 are insulated from each other. In addition, in FIG. 8(F), the connecting member 123 passes through the opening of the first plane 131 in a state of non-contact with the first plane 131. That is, the connecting member 123 and the first plane 131 are insulated from each other.

Each of the structures of FIGS. 8(C) to 8(F) mentioned above is an increased inductance-type EBG structure in which the inductance is increased by providing an inductor in either of the first plane 131 or the second plane 111, on a mushroom-type EBG structure basis. Specifically, in FIGS. 8(C) and 8(E), the conductor element 122 is equivalent to a head portion of a mushroom, and forms a capacitance between the conductor element and the second plane 111 opposite thereto. The connecting member 123 is equivalent to a shank of the mushroom, and forms an inductance together with the inductor provided in the first plane 131. On the other hand, in FIGS. 8(D) and 8(F), the conductor element 122 is equivalent to the head portion of the mushroom, and forms a capacitance between the conductor element and the first plane 131 opposite thereto. The connecting member 123 is equivalent to the shank of the mushroom, and forms an inductance together with the inductor provided in the second plane 111.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor element 122 close to each of the opposite planes forming a capacitance to increase the capacitance or by increasing the length of the above-mentioned inductor to increase the inductance. However, even when the conductor element 122 is not brought close to the opposite plane, the essential effect of the invention is not influenced at all.

FIGS. 8(G) to 8(J) are an example in which the connecting member 123 is a through via.

In FIG. 8(G), the through via (connecting member 123) electrically connected to the conductor element 122 is electrically connected to the first plane 131 through the inductor formed in the opening of the first plane 131. The through via (connecting member 123) passes through the opening of the second plane 111 in a state of non-contact with the second plane 111. That is, the through via (connecting member 123) and the second plane 111 are insulated from each other.

In FIG. 8(H), the through via (connecting member 123) electrically connected to the conductor element 122 is electrically connected to the second plane 111 through the inductor formed in the opening of the second plane 111. The through via (connecting member 123) passes through the opening of the first plane 131 in a state of non-contact with the first plane 131. That is, the through via (connecting member 123) and the first plane 131 are insulated from each other.

In FIG. 8(I), the B layer 120 on which the conductor element 122 is formed is opposite to the C layer 130 (first layer) on which the first plane 131 is formed, through the A layer 110 (second layer) on which the second plane 111 is formed. The through via (connecting member 123) is electrically connected to the first plane 131 through the inductor formed in the opening of the first plane 131, and passes through the opening provided in the second plane 111 in a state of non-contact with the second plane 111. The conductor element 122 is opposite to the second plane 111, and is electrically connected to the through via (connecting member 123) passing through the opening provided in the second plane 111.

In FIG. 8(J), the B layer 120 on which the conductor element 122 is formed is opposite to the A layer 110 (second layer) on which the second plane 111 is formed, through the C layer 130 (first layer) on which the first plane 131 is formed. The through via (connecting member 123) is electrically connected to the second plane 111 through the inductor formed in the opening of the second plane 111, and passes through the opening provided in the first plane 131 in a state of non-contact with the first plane 131. The conductor element 122 is opposite to the first plane 131, and is electrically connected to the through via (connecting member 123) passing through the opening provided in the first plane 131.

Each of the structures of FIGS. 8(G) to 8(J) mentioned above is a modified example of the increased inductance-type EBG structure in which the inductance is increased by forming an inductor in either of the first plane 131 or the second plane 111, on a mushroom-type EBG structure basis. Specifically, in FIGS. 8(G) and 8(I), the conductor element 122 is equivalent to a head portion of a mushroom, and forms a capacitance between the conductor element and the second plane 111 opposite thereto. The connecting member 123 is equivalent to a shank of the mushroom, and forms an inductance together with the inductor provided in the first plane 131. On the other hand, in FIGS. 8(H) and 8(J), the conductor element 122 is equivalent to the head portion of the mushroom, and forms a capacitance between the conductor element and the first plane 131 opposite thereto. The connecting member 123 is equivalent to the shank of the mushroom, and forms an inductance together with the inductor provided in the second plane 111.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor element 122 close to each of the opposite planes forming a capacitance to increase the capacitance or by increasing the length of the above-mentioned inductor to increase the inductance. However, even when the conductor element 122 is not brought close to the opposite plane, the essential effect of the invention is not influenced at all. Meanwhile, in FIG. 8, the above-mentioned inductor is spiral in shape, but the shape thereof may not be limited thereto. For example, the inductor may be linear in shape, and may be meandering in shape.

Figure 9:
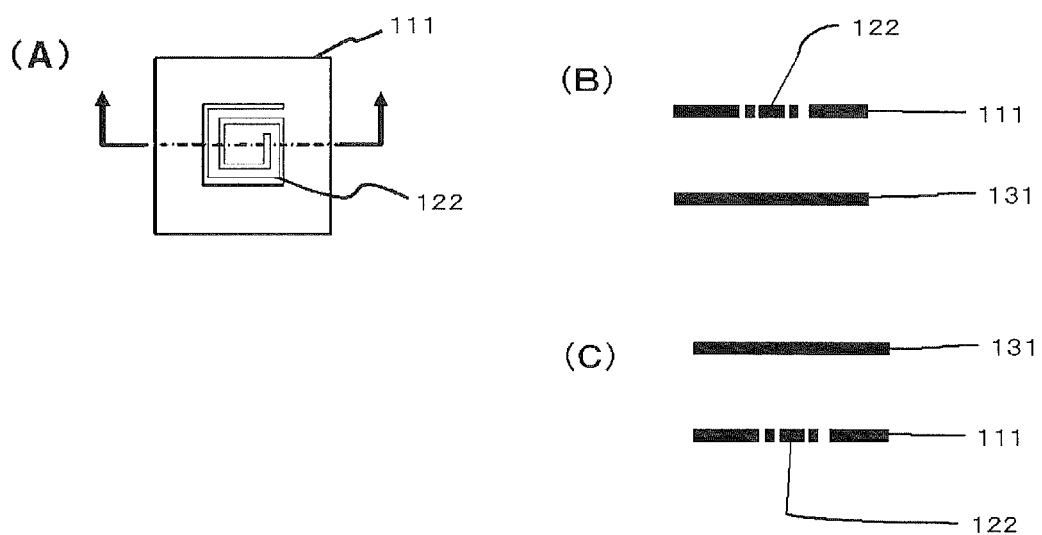
FIG. 9 is a diagram illustrating shapes and positions of the conductor element, the first conductor, the second conductor and the connecting member which are used in the first embodiment.
Figure 10:
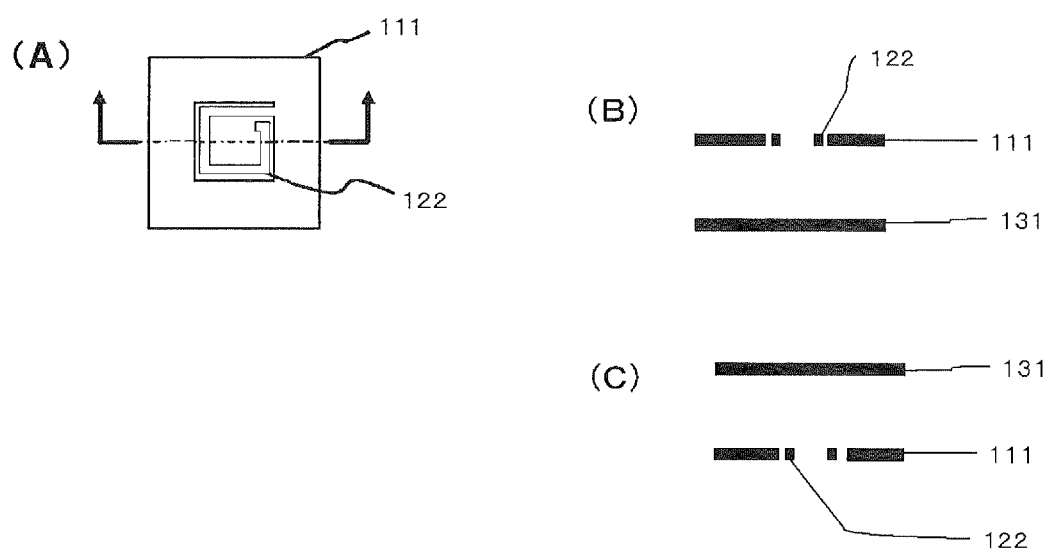
FIG. 10 is a diagram illustrating shapes and positions of the conductor element, the first conductor, the second conductor and the connecting member which are used in the first embodiment.
Figure 11:
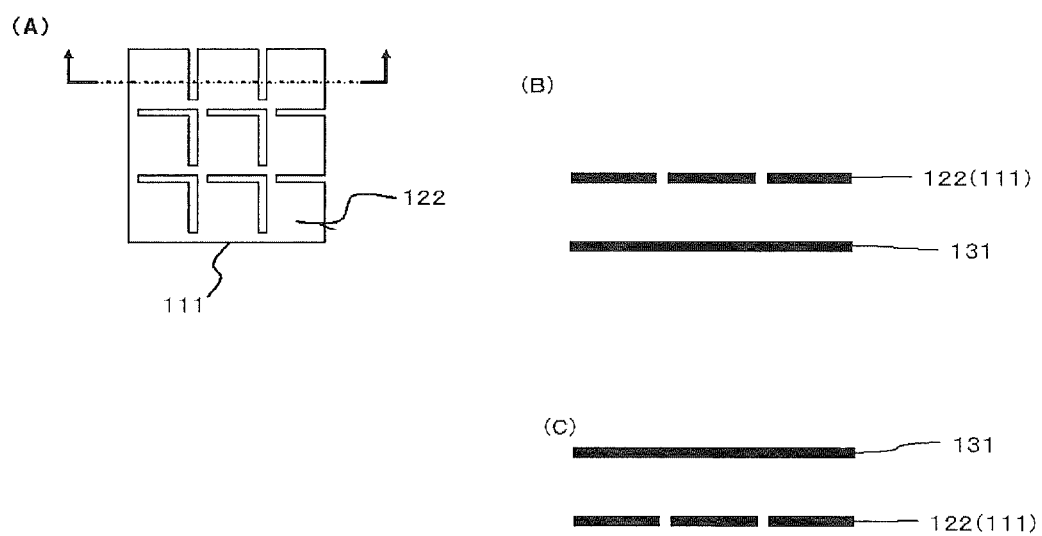
FIG. 11 is a diagram illustrating shapes and positions of the conductor element, the first conductor, the second conductor and the connecting member which are used in the first embodiment.

FIGS. 9 to 11 described subsequently are an example in which the conductor element 122 is arranged in the C layer 130 (first layer) having the first plane 131 or the A layer 110 (second layer) having the second plane 111. That is, the above drawings are an example in which the conductor element 122, and the first plane 131 or the second plane 111 are formed on the same layer. In such an example, it is possible to further the thickness of the interconnect substrate 100 than in the above-mentioned example. Meanwhile, in FIGS. 9 to 11, the connecting member 123 is not required.

FIG. 9(A) is a top view illustrating an example of the conductor element 122 formed in the second plane 111. The second plane 111 has an opening. The conductor element 122 is constituted by an insular conductor (quadrangular conductor located at the center of the second plane 111 in FIG. 9(A)) formed in the inside of the opening and an inductor that connects the insular conductor and the second plane 111. Meanwhile, in FIG. 9(A), the inductor spirally surrounds the insular conductor, but the shape thereof may not be limited thereto. For example, the inductor may be linear-shaped, and may be meandering-shaped. In addition, the shape, the size and the like of the insular conductor (quadrangular conductor located at the center of the second plane 111 in FIG. 9(A)) formed in the inside of the opening are not particularly limited, but can be variously set.

FIGS. 9(B) and 9(C) are cross-sectional views illustrating chief parts of the interconnect substrate 100 including the conductor element 122 and the second plane 111 shown in FIG. 9(A). In FIG. 9(B), the conductor element 122 formed in the inside of the second plane 111 is opposite to the first plane 131. FIG. 9(C) is a diagram in which the vertical relationship between the A layer 110 (second layer) having the second plane 111 and the C layer 130 (first layer) having the first plane 131 is reversed. Meanwhile, a configuration is also possible in which the first plane 131 and the second plane 111 shown in FIGS. 9(B) and 9(C) are reversed, and the conductor element 122 formed in the inside of the first plane 131 is opposite to the second plane 111.

The structure of FIG. 9 mentioned above is a modified example of the mushroom-type EBG structure. The head portion and the shank of the mushroom are provided in the opening of the first plane 131 or the second plane 111, so that the number of layers required for an EBG structure is reduced, and thus the connecting member 123 is not required. Specifically, in FIGS. 9(B) and 9(C), the insular conductor (quadrangular conductor located at the center of the second plane 111 in FIG. 9(A)) constituting the conductor element 122 formed in the inside of the second plane 111 is equivalent to the head portion of the mushroom, and forms a capacitance between the conductor and the first plane 131 opposite thereto. In addition, the inductor constituting the conductor element 122 is equivalent to the shank of the mushroom, and forms an inductance. On the other hand, when the first plane 131 and the second plane 111 shown in FIGS. 9(B) and 9(C) are reversed, and the conductor element 122 formed in inside of the first plane 131 is opposite to the second plane 111, the insular conductor constituting the conductor element 122 formed in the inside of the first plane 131 is equivalent to the head portion of the mushroom, and forms a capacitance between the conductor and the second plane 111 opposite thereto. In addition, the inductor constituting the conductor element 122 is equivalent to the shank of the mushroom, and forms an inductance.

Similarly to the mushroom-type EBG structure, the structure of FIG. 9 can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing a layer, on which the above-mentioned insular conductor (quadrangular conductor located at the center of the second plane 111 in FIG. 9(A)) is disposed, close to the opposite plane forming a capacitance to increase the capacitance. However, even when the layer on which the above-mentioned insular conductor is disposed is not brought close to the power plane opposite thereto, the essential effect of the invention is not influenced at all.

FIG. 10(A) is a top view illustrating an example of the conductor element 122 formed in the inside of the second plane 111. The second plane 111 has an opening. The conductor element 122 is a transmission line of which one end is electrically connected to the second plane 111 in a deep spot of the opening and the other end is an open end which is not electrically connected to the second plane 111. Meanwhile, in FIG. 10(A), the shape of the transmission line is spiral, but the shape thereof may not be limited thereto. For example, the transmission line may be linear-shaped, and may be meandering-shaped.

FIGS. 10(B) and 10(C) are cross-sectional views illustrating chief parts of the interconnect substrate 100 including the conductor element 122 and the second plane 111 shown in FIG. 10(A). In FIG. 10(B), the conductor element 122 formed in the inside of the second plane 111 is opposite to the first plane 131. FIG. 10(C) is a diagram in which the vertical relationship between the A layer 110 (second layer) having the second plane 111 and the C layer 130 (first layer) having the first plane 131 is reversed. Meanwhile, a configuration is also possible in which the first plane 131 and the second plane 111 shown in FIGS. 10(B) and 10(C) are reversed, and the conductor element 122 formed in the inside of the first plane 131 is opposite to the second plane 111.

The structure of FIG. 10 mentioned above is a modified example of the open stub-type EBG structure. The transmission line functioning as an open stub is provided in the opening of one of the first plane 131 or the second plane 111, so that the number of layers required for an EBG structure is reduced, and thus the connecting member 123 is not required. Specifically, in FIGS. 10(B) and 10(C), the conductor element 122 formed in the inside of the second plane 111 is electrically coupled to the first plane 131 opposite thereto, to thereby form a microstrip line using the first plane 131 as a return path. One end of the above-mentioned microstrip line is formed as an open end, and functions as an open stub. On the other hand, when the first plane 131 and the second plane 111 shown in FIGS. 10(B) and 10(C) are reversed, and the conductor element 122 formed in the inside of the first plane 131 is opposite to the second plane 111, the conductor element 122 formed in the inside of the first plane 131 is electrically coupled to the second plane 111 opposite thereto, to thereby form a microstrip line using the second plane 111 as a return path. One end of the above-mentioned microstrip line is formed as an open end, and functions as an open stub.

The open stub-type EBG structure can be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the conductor element 122. In addition, it is preferable that the conductor element 122 forming a microstrip line and the power plane opposite thereto be close to each other. This is because as the distance between the conductor element and the power plane decreases, the characteristic impedance of the above-mentioned microstrip line becomes lower, and thus the band gap zone can be widened. However, even when the conductor element 122 is not brought close to the power plane opposite thereto, the essential effect of the invention is not influenced at all.

FIG. 11(A) is a top view illustrating an example of the conductor element 122 formed in the inside of the second plane 111. The conductor elements 122 are a plurality of insular conductors formed in the second plane 111, and the adjacent insular conductors are electrically connected to each other.

FIGS. 11(B) and 11(C) are cross-sectional views illustrating chief parts of the interconnect substrate 100 including the conductor element 122 and the second plane 111 shown in FIG. 11(A).

FIGS. 11(B) and 11(C), the conductor element 122 formed in the inside of the second plane 111 (not shown) is opposite to the first plane 131. FIG. 11(C) is a diagram in which the vertical relationship between the A layer 110 (second layer) having the second plane 111 and the C layer 130 (first layer) having the first plane 131 is reversed. Meanwhile, a configuration is also possible in which the first plane 131 and the second plane 111 (not shown) in FIGS. 11(B) and 11(C) are reversed, and the conductor element 122 formed in the inside of the first plane 131 is opposite to the second plane 111.

In the structure of FIG. 11 mentioned above, the adjacent insular conductors (conductor elements 122) are electrically coupled to each other to thereby form a capacitance, and a connection portion that electrically connects these insular conductors (conductor elements 122) to each other forms an inductance to thereby function as an EBG structure. In the EBG structure shown in FIG. 11, the resonance frequency of a parallel resonance circuit formed of the above-mentioned capacitance and the above-mentioned inductance provides a center frequency of the band gap zone. Therefore, the band gap zone can be shifted to a lower frequency by decreasing the distance between the above-mentioned insular conductors (conductor elements 122), and increasing a capacitance or increasing the length of the above-mentioned connection portion to increase an inductance.

Next, an effect of the embodiment will be described with reference to FIG. 1.

As shown in FIG. 1, in the interconnect substrate 100 in which the electronic element 141 and the first plane 131 separated in an island shape are electrically connected to each other through the connecting member 142, noise propagated from the electronic element 141 through the connecting member 142 to the first plane 131 is in a resonant state in a region interposed between the first plane 131 and the second plane 111. The electric field reaches its maximum in the end of the first plane 131 due to an antinode of a voltage in the end thereof, and thus there is a concern of noise being leaked to space by an operation similar to a patch antenna.

The interconnect substrate of the embodiment is configured to be capable of solving the above-mentioned problem. That is, in the embodiment, at least one or more conductor elements 122 are disposed in the conductor element disposition region 121 located in a region less than a quarter of the wavelength at a frequency of noise desired to be suppressed from the end of the first plane 131. Moreover, in the configuration in which the connecting member 123 is included, when the interconnect substrate is seen in a plan view, the connecting member 123 is disposed in a region less than a quarter of the wavelength at a frequency of noise desired to be suppressed from the end of the first plane 131. That is, in the interconnect substrate of the embodiment, when the interconnect substrate is seen in a plan view, an EBG structure formed of a unit cell is disposed in a region less than a quarter of the wavelength at a frequency of noise desired to be suppressed from the end of the first plane 131. In such a case, the EBG structure causes series resonance at a frequency of noise desired to be suppressed, and thus the first plane 131 and the second plane 111 are short-circuited in a place where the EBG structure is disposes. Noise propagated from the electronic element 141 through the connecting member 142 to the first plane 131 changes to a node of a voltage in a place in which the EBG structure is disposed, due to the action of the above-mentioned EBG structure. The place, having node of a voltage, in which the EBG structure is disposed is located in the conductor element disposition region 121. That is, the place, having a node of a voltage, in which the EBG structure is disposed is present in a place less than a quarter of the wavelength from the end of the first plane 131. For this reason, since the end of the first plane 131 does not have an antinode of a voltage, it is possible to suppress the leakage of noise to space.

In addition, the band gap zone of the EBG structure in the embodiment includes a frequency of noise generated from the electronic element 141, and thus it is possible to obtain a higher noise suppressing effect.

Figure 12:
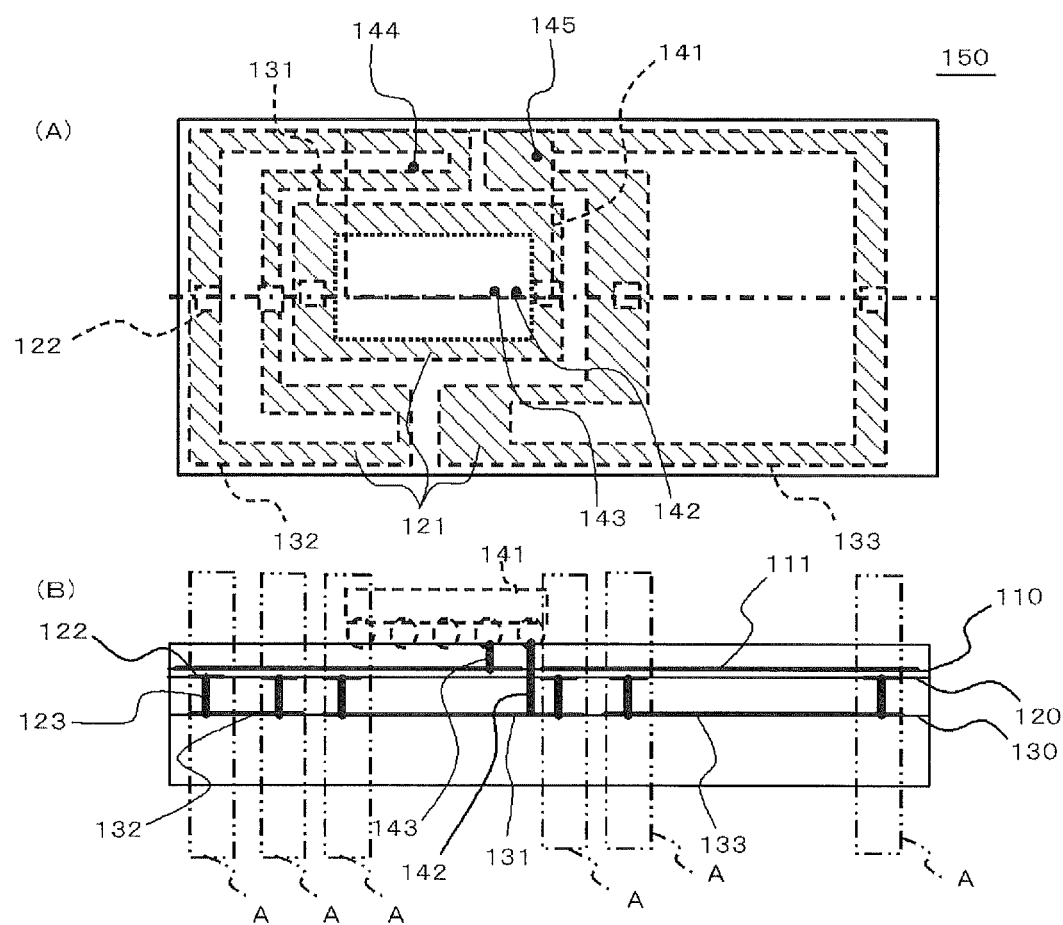
FIG. 12 is a top view and a cross-sectional view illustrating a modified example of the interconnect substrate according to the first embodiment.

In addition, like an interconnect substrate 150 of FIG. 12, even when the electronic element 141 is connected to a plurality of first planes 131, 132, and 133 and a plurality of connecting members 142, 144, and 145 which are different and separated from each other, the EBG structure formed of at least one unit cell in each of the planes is disposed in the conductor element disposition region 121 present in less than a quarter of the wavelength at a frequency of noise desired to be suppressed from the end of each of the first planes 131, 132, and 133, and thus it is possible to suppress the leakage of noise to space using the same effect as that of the interconnect substrate 100. Meanwhile, FIG. 12 is a diagram illustrating the interconnect substrate 150 in the same way as that of the interconnect substrate 100 of FIG. 1.

According to such an interconnect substrate 100 of the embodiment, it is possible to suppress an increase in electromagnetic leakage by causing a plane, separated in an island shape, to which an electronic element is connected in the vicinity of an arbitrary frequency to operate similarly to a patch antenna, without damaging the degree of freedom of a circuit design.

In addition, according to interconnect substrate 100 of the embodiment, it is possible to suppress an increase in electromagnetic leakage by causing a slit formed between a plane, separated in an island shape, to which an electronic element is connected in the vicinity of an arbitrary frequency and a plane adjacent thereto to operate similarly to a slot antenna, without damaging the degree of freedom of a circuit design.

Meanwhile, in an electronic device in which the electronic element 141 is mounted to a predetermined position of the interconnect substrate 100 of the embodiment, it is also possible to realize the same operations and effects. A unit that mounts the electronic element 141 to a predetermined position of the interconnect substrate 100 of the embodiment can be realized according to the related art.

Second Embodiment

Figure 13:
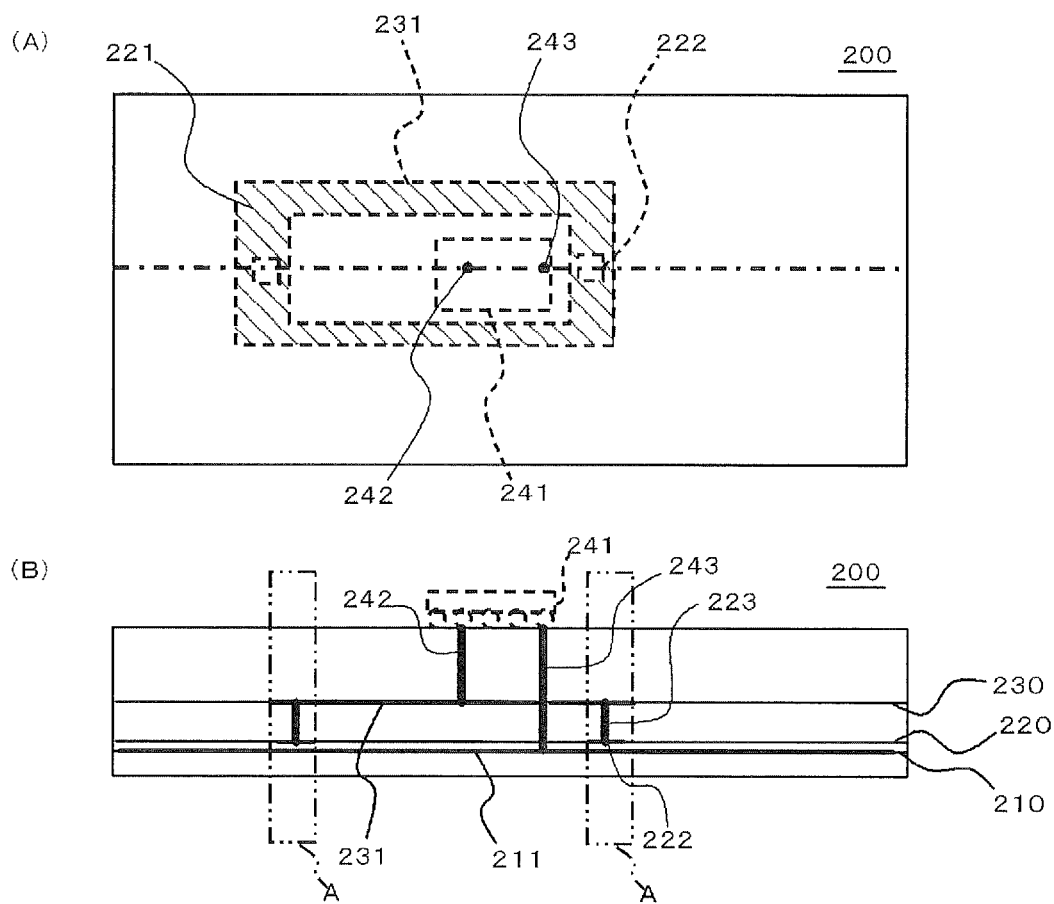
FIG. 13 is an example illustrating a top view and a cross-sectional view of an interconnect substrate according to a second embodiment.

FIGS. 13(A) and 13(B) are an example illustrating a top view and a cross-sectional view of an interconnect substrate 200 according to a second embodiment of the invention. More specifically, FIG. 13(A) is a top view of the interconnect substrate 200, and FIG. 13(B) is a cross-sectional view of the interconnect substrate 200 in the long-dashed short-dashed line shown in FIG. 13(A). The interconnect substrate 200 of the embodiment can have the same configuration as that of the interconnect substrate 100 according to the first embodiment, except that the vertical positional relationship between a first plane 231 and a second plane 211 is different.

The interconnect substrate 200 shown in FIGS. 13(A) and 13(B) is a multilayer substrate including at least an A layer 210, a B layer 220 and a C layer 230 which are opposite to each other. The A layer 210 has the second plane 211. The B layer 220 has a conductor element 222. The C layer 230 has the first plane 231. The conductor element 222 and the first plane 231 are electrically connected to each other through a connecting member 223. Meanwhile, the interconnect substrate 200 may include layers other than the above-mentioned three layers. For example, an insulating layer may be located between each of the layers. Furthermore, a signal line layer in which only a signal line is buried in an insulating layer may be located between each of the layers.

In addition, the interconnect substrate 200 may include a hole, a via and the like, which are not shown, in the range consistent with the configuration of the invention. Further, in any one or more layers of the A layer 210, the B layer 220, and the C layer 230, a signal line may be arranged in the range consistent with the configuration of the invention.

Meanwhile, in FIGS. 13(A) and 13(B), an electronic element 241 is shown by the broken line. This means that the electronic element 241 is not mounted. That is, a region intended to mount the electronic element 241 is determined on the surface of the interconnect substrate 200. The interconnect substrate 200 includes a connecting member 242 that electrically connects the electronic element 241 and the first plane 231 which is located on the C layer 230. Further, the interconnect substrate 200 includes a connecting member 243 that electrically connects the electronic element 241 and the second plane 211 which is located on the A layer 210.

In addition to these connecting members, the interconnect substrate 200 may include a connecting member that electrically connects the electronic element 241 and a plane or a line. For example, the member is a connecting member or the like for electrical connection to a signal line or the like. Here, the electronic element 241 is assumed to be a device such as an LSI. The number of electronic elements 241 mounted to the interconnect substrate 200 may be one, or may be two or more.

Figure 14:
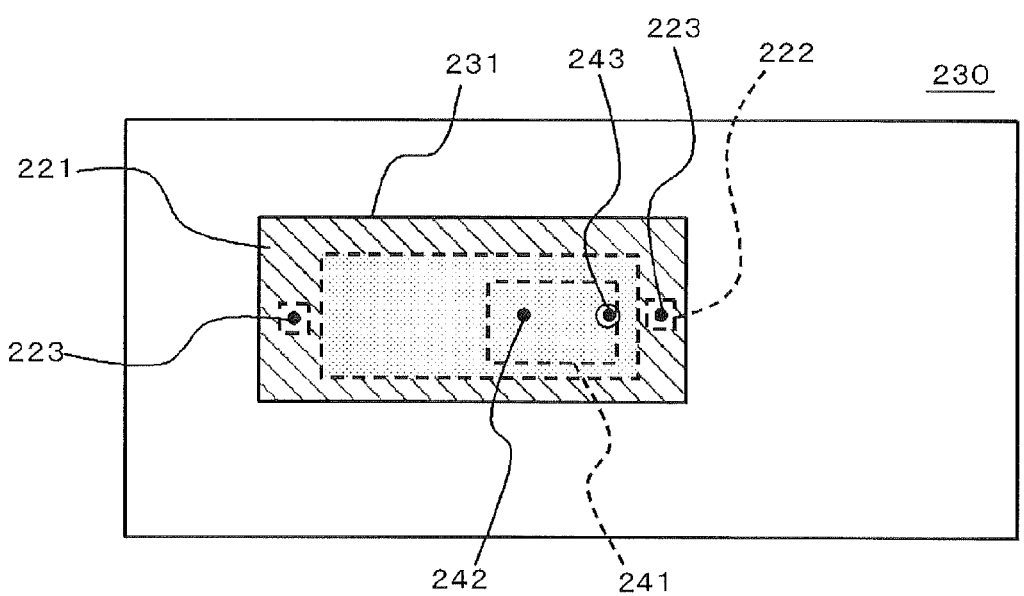
FIG. 14 is a diagram illustrating an example of a C layer of the second embodiment.

FIG. 14 is a plan view illustrating the C layer 230 of the interconnect substrate 200 shown in FIGS. 13(A) and 13(B). The C layer 230 (first layer) has the first plane 231 (first conductor), separated in an island shape, which is formed of a conductive material.

The first plane 231 has a connection point which electrically connects the connecting member 242 electrically connected to the electronic element 241 and the connecting member 223 electrically connected to the conductor element 222. In addition, the first plane 231 has an opening through which the connecting member 243 passes in a state of non-contact. That is, the first plane 231 and the connecting member 243 are insulated from each other. The first plane 231 is a power plane or a ground plane. Meanwhile, the shape, the size and the like of the first plane 231 are not particularly limited, but can be variously set according to the related art. A region in the C layer 230 in which the first plane 231 is not formed may be an insulator, may be a conductor, and may be a mixture thereof.

Figure 15:
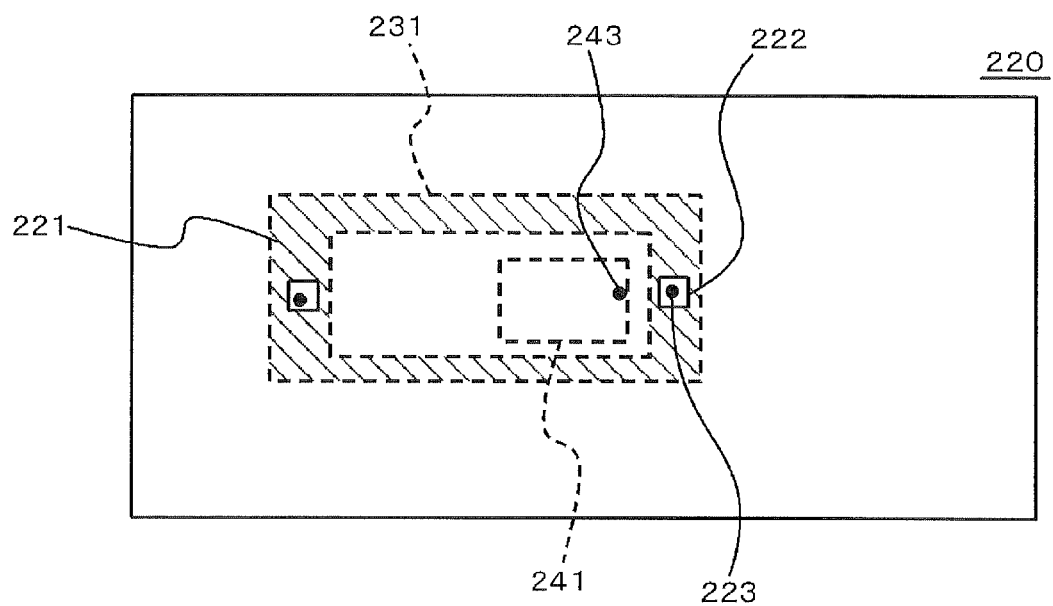
FIG. 15 is a diagram illustrating an example of a B layer of the second embodiment.

FIG. 15 is a plan view illustrating the B layer 220 of the interconnect substrate 200 shown in FIGS. 13(A) and 13(B). The B layer 220 is located between the C layer 230 and the A layer 210. On such a B layer 220, at least one or more conductor elements 222 (second conductors) are disposed in a conductor element disposition region 221 (first region, or region shown by the hatching in the drawing) which is a region less than a quarter of the wavelength at a frequency of noise desired to be suppressed, from a position opposite to the end of the first plane 231. Meanwhile, the conductor element disposition region 221 is a region that satisfies the above condition, and may be a region opposite to the first plane 231. The "noise desired to be suppressed" is, for example, noise propagated from the electronic element 241 through the connecting member 242 to the first plane 231.

Here, the conductor element 222 is an insular conductor. The planar shape of the conductor element 222 is not particularly limited, but the conductor element may be formed in a triangular shape, a pentagonal shape, and other polygonal shapes, in addition to a quadrangular shape shown, and may be formed in a circular shape, an elliptical shape and the like. In addition, the number of conductor elements 222 is not particularly limited, but a plurality of conductor elements may be provided. Meanwhile, a plurality of conductor elements are provided, the conductor elements 222 may be repeatedly, for example, periodically arranged at a predetermined distance. A region in the B layer 220 in which the conductor element 222 is not arranged is formed of an insulator, and is insulated from the connecting member 242.

The conductor element 222 is electrically connected to the first plane 231 through the connecting member 223. When the interconnect substrate 200 is seen in a plan view, the connecting member 223 is disposed in a region less than a quarter of the wavelength at a frequency of the noise desired to be suppressed from a position opposite to the end of the first plane 231, for example, a region that satisfies the above condition, and a region opposite to the first plane 231. In FIG. 13(B), the connecting member 223 is disposed within the region A.

Meanwhile, here, although a configuration is described in which the connecting member 223 electrically connects the first plane 231 and the conductor element 222, a configuration is also present in which the connecting member 223 does not electrically connect the first plane 231 and the conductor element 222, but electrically connects the second plane 211 and the conductor element 222. In addition, a configuration is also present in which the connecting member 223 is not provided. Such configurations will be described later.

Figure 16:
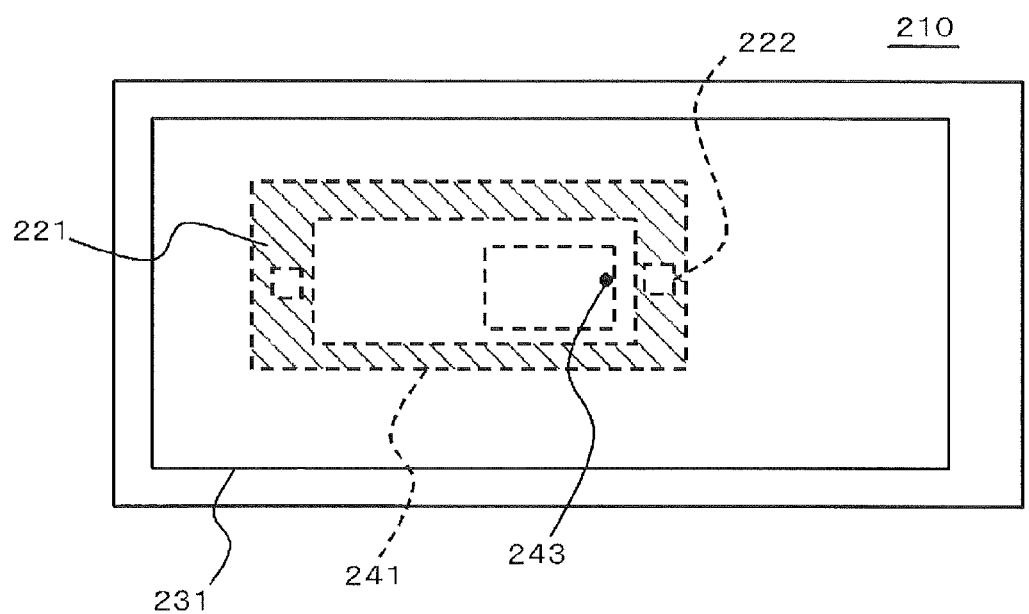
FIG. 16 is a diagram illustrating an example of an A layer of the second embodiment.

FIG. 16 is a plan view illustrating the A layer 210 of the interconnect substrate 200 shown in FIGS. 13(A) and 13(B). The second plane 211 (third conductor) is a sheet-like conductor, is located on the A layer 210 (second layer) which is a layer located above the C layer 230, and extends to a region opposite to the conductor element disposition region 221. That is, the second plane 211 and the conductor element 222 are opposite to each other through an insulator layer.

The second plane 211 is a power plane or a ground plane. That is, when the first plane 231 is a power plane, the second plane 211 is a ground plane. When the first plane 231 is a ground plane, the second plane 211 is a power plane.

The connecting member 243 passes through an opening provided in the first plane 231, and electrically connects the electronic element 241 and the second plane 211. That is, the connecting member 243 is insulated from the first plane 231.

Meanwhile, a region in the A layer 210 in which the second plane 211 is not formed may be an insulator, may be a conductor, and may be a mixture thereof.

Here, in the interconnect substrate 200 of the embodiment, a problem can occur in that noise propagated from the electronic element 241 through the connecting member 242 to the first plane 231 leaks to space by the first plane 231 operating similarly to a patch antenna.

However, the interconnect substrate 200 of the embodiment is configured to be capable of solving the above-mentioned problem.

That is, in the interconnect substrate 200 of the embodiment, the above-mentioned configuration is adopted, and thus a unit cell of an EBG structure is formed by the conductor element 222, the first plane 231, the second plane 211, and the connecting member 223. It is possible to suppress noise propagated by the above-mentioned first plane 231 operating similarly to a patch antenna, using the EBG structure in which at least one of the unit cells is present.

Meanwhile, in each of the above-mentioned EBG structures, the frequency of noise generated by the electronic element 241 is preferably included in a band gap zone. In addition, the unit cell of the EBG structure formed by the interconnect substrate 200 of the embodiment has a structure including the connecting member 223, but is not necessarily limited thereto. That is, in the interconnect substrate 200, a connecting member may not necessarily be formed in an intermediate layer between the first plane 231 and the second plane 211. As the unit cells of various EBG structures which are capable of being applied to the interconnect substrate 200, the examples shown in FIGS. 5 to 11 can be applied.

Meanwhile, it is possible to set a desired band gap zone by adjusting the distance between the conductor element 222 and the first plane 231, the distance between the conductor element 222 and the second plane 211, the thickness of the connecting member 223, the mutual distance between the conductor elements 222, and the like.

The shapes and the positions of the conductor element 222 and the connecting member 223 which are shown in FIGS. 13 to 16 are an example, and it is possible to adopt various configurations in a range in which an EBG structure can be formed. For example, the above configurations can be realized by a combination of the examples shown in FIGS. 5 to 11.

Here, an effect of the second embodiment will be described. In the embodiment, the interconnect substrate 200 in which the first plane 231 separated in an island shape is located above the second plane 211 has been described. In such an interconnect substrate 200 of the embodiment, it is possible to realize the same operations and effects as those of the interconnect substrate 100 of the first embodiment.

Moreover, in an electronic device in which the electronic element 241 is mounted to a predetermined position of the interconnect substrate 200, it is also possible to realize the same operations and effects. A unit that mounts the electronic element 241 to a predetermined position of the interconnect substrate 200 of the embodiment can be realized according to the related art.

Third Embodiment

Figure 17:
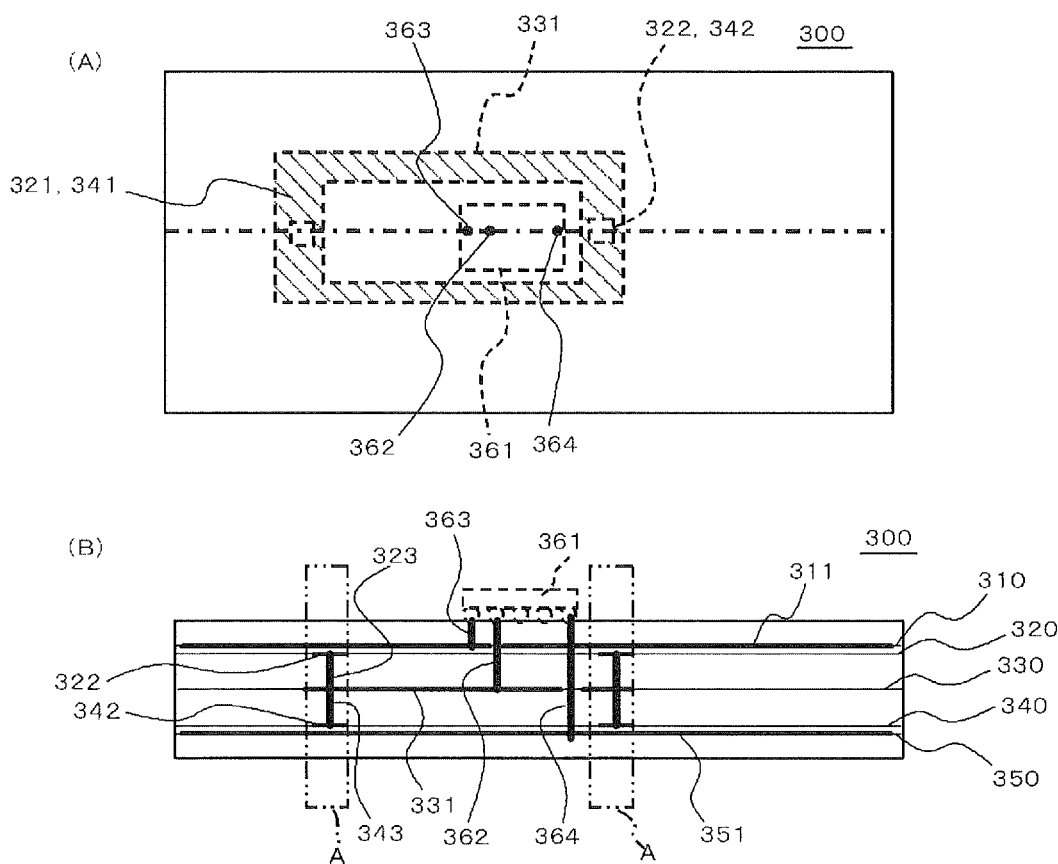
FIG. 17 is an example illustrating a top view and a cross-sectional view of an interconnect substrate according to a third embodiment.

FIGS. 17(A) and 17(B) are an example illustrating a top view and a cross-sectional view of an interconnect substrate 300 of a third embodiment. More specifically, FIG. 17(A) is a top view of the interconnect substrate 300, and FIG. 17(B) is a cross-sectional view of the interconnect substrate 300 in the long-dashed short-dashed line shown in FIG. 17(A).

The interconnect substrate 300 shown in FIGS. 17(A) and 17(B) is a multilayer substrate including at least an A layer 310, a B layer 320, a C layer 330, a ID layer 340, and an E layer 350 which are opposite to each other. The A layer 310 has a second plane 311. The B layer 320 has a conductor element 322. The C layer 330 has a first plane 331. The D layer 340 has a conductor element 342. The E layer 350 has a second plane 351. The conductor element 322 and the first plane 331 are electrically connected to each other through a connecting member 323. In addition, the conductor element 342 and the first plane 331 are electrically connected to each other through a connecting member 343. Meanwhile, the interconnect substrate 300 may include layers other than the above-mentioned five layers. For example, an insulating layer may be located between each of the layers. Furthermore, a signal line layer in which only a signal line is buried in an insulating layer may be located between each of the layers.

In addition, the interconnect substrate 300 may include a hole, a via and the like, which are not shown, in the range consistent with the configuration of the invention. Further, in any one or more layers of the A layer 310, the B layer 320, the C layer 330, the D layer 340, and the E layer 350, a signal line may be arranged in the range consistent with the configuration of the invention.

Meanwhile, in FIGS. 17(A) and 17(B), an electronic element 361 is shown by broken line. This means that the electronic element 361 is not mounted. That is, a region intended to mount the electronic element 361 is determined on the surface of the interconnect substrate 300. The interconnect substrate 300 includes a connecting member 362 that electrically connects the electronic element 361 and the first plane 331. Further, the interconnect substrate 300 includes a connecting member 363 that electrically connects the electronic element 361 and the second plane 311 which is located on the A layer 310 and a connecting member 364 that electrically connects the electronic element 361 and the second plane 351 which is located on the E layer 350.

In addition to these connecting members, the interconnect substrate 300 may include a connecting member that electrically connects the electronic element 361 and a plane or a line. For example, the member is a connecting member or the like for electrical connection to a signal line or the like. Here, the electronic element 361 is assumed to be a device such as an LSI. The number of electronic elements 361 mounted to the interconnect substrate 300 may be one, or may be two or more.

Meanwhile, the conductor element 322 and the conductor element 342 are not necessarily arranged at an overlapping position when seen in a plan view, but may be arranged at different positions when seen in a plan view.

Figure 18:
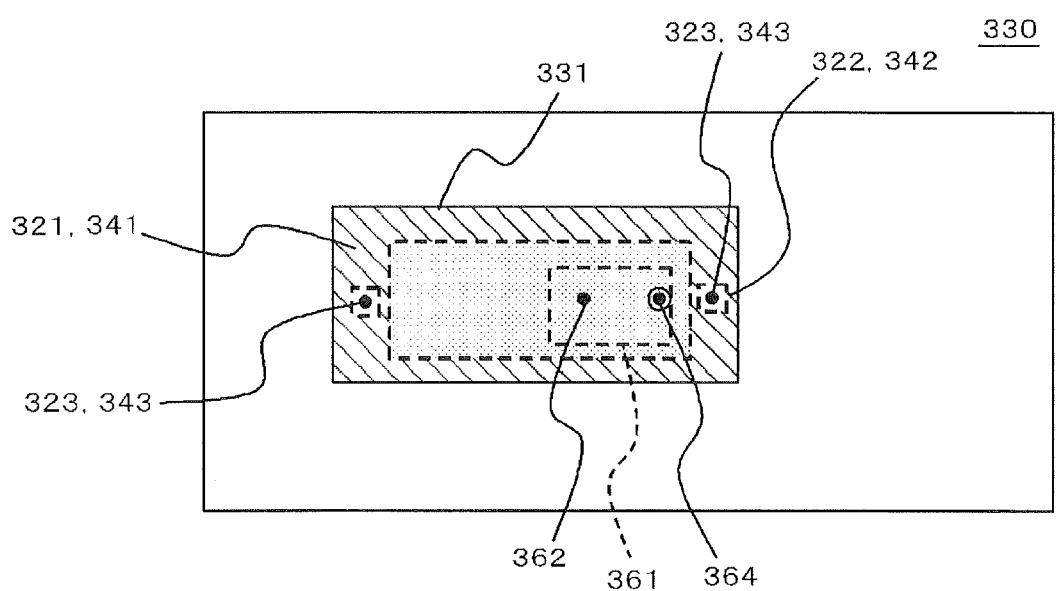
FIG. 18 is a diagram illustrating an example of a C layer of the third embodiment.

FIG. 18 is a plan view illustrating the C layer 330 of the interconnect substrate 300 shown in FIGS. 17(A) and 17(B). The C layer 330 (first layer) has the first plane 331 (first conductor), separated in an island shape, which is formed of a conductive material.

The first plane 331 has a connection point which is electrically connected to the connecting member 323, the connecting member 343, and the connecting member 362. In addition, the first plane 331 has an opening through which the connecting member 364 passes in a state of non-contact. That is, the first plane 331 and the connecting member 364 are insulated from each other. The first plane 331 is a power plane or a ground plane. Meanwhile, the shape, the size and the like of the first plane 331 are not particularly limited, but can be variously set according to the related art. A region in the C layer 330 in which the first plane 331 is not formed may be an insulator, may be a conductor, and may be a mixture thereof.

Figure 19:
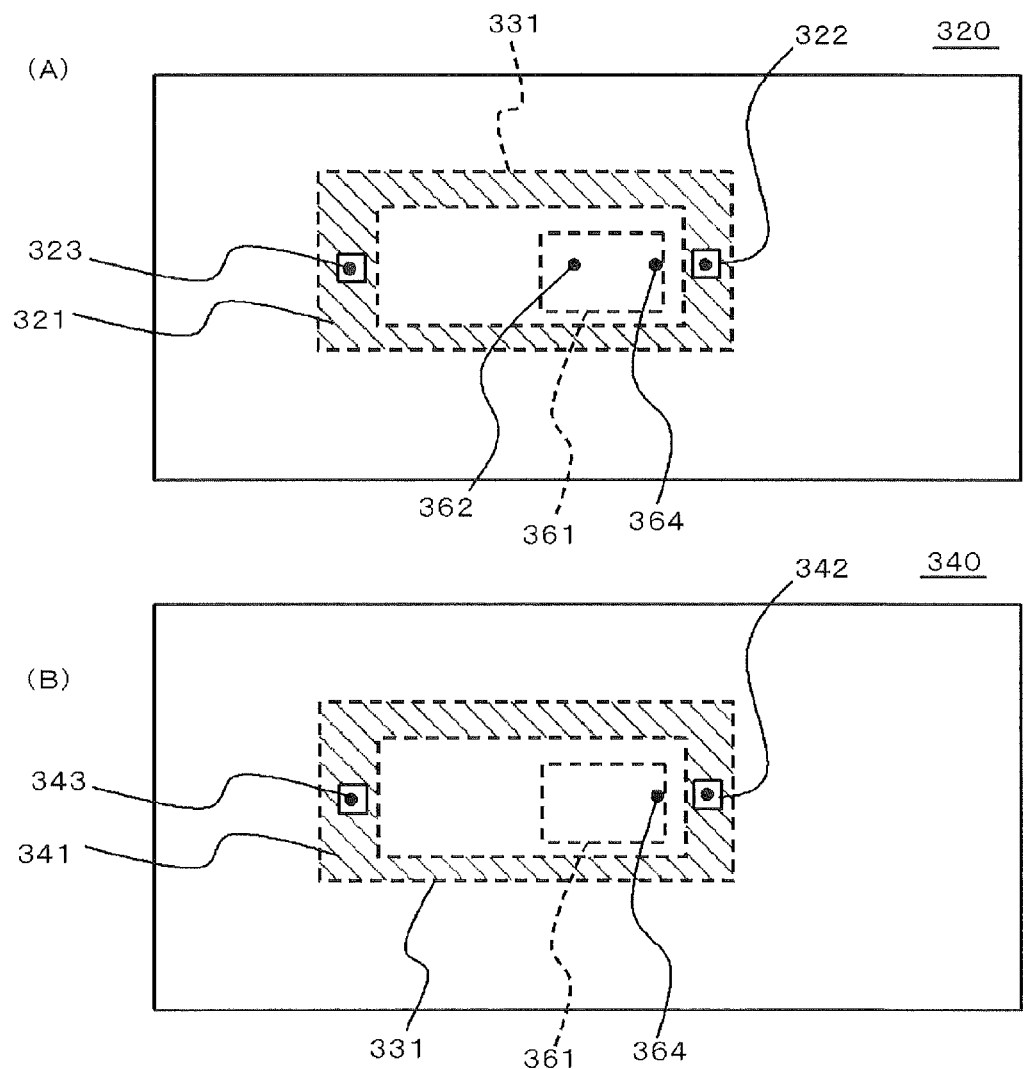
FIG. 19 is a diagram illustrating an example of a B layer and a D layer of the third embodiment.

FIG. 19(A) is a plan view illustrating the B layer 320 of the interconnect substrate 300 shown in FIGS. 17(A) and 17(B). The B layer 320 is located between the C layer 330 and the A layer 310. On such a B layer 320, at least one or more conductor elements 322 (second conductors) are disposed in a conductor element disposition region 321 (first region, or region shown by the hatching in the drawing) which is a region up to a position less than a quarter of the wavelength at a frequency of noise desired to be suppressed, from a position opposite to the end of the first plane 331. Meanwhile, the conductor element disposition region 321 is a region that satisfies the above condition, and may be a region opposite to the first plane 331. The "noise desired to be suppressed" is, for example, noise propagated from the electronic element 361 through the connecting member 362 to the first plane 331.

Here, the conductor element 322 is an insular conductor. The planar shape of the conductor element 322 is not particularly limited, but the conductor element may be formed in a triangular shape, a pentagonal shape, and other polygonal shapes, in addition to a quadrangular shape shown, and may be formed in a circular shape, an elliptical shape or the like. In addition, the number of conductor elements 322 is not particularly limited, but a plurality of conductor elements may be provided. Meanwhile, a plurality of conductor elements are provided, the conductor elements 322 may be repeatedly, for example, periodically arranged at a predetermined distance. A region in the B layer 320 in which the conductor element 322 is not arranged is formed of an insulator, and is insulated from the connecting member 323.

The conductor element 322 is electrically connected to the first plane 331 through the connecting member 323. When the interconnect substrate 300 is seen in a plan view, the connecting member 323 is disposed in a region less than a quarter of the wavelength at a frequency of the noise desired to be suppressed from a position opposite to the end of the first plane 331, for example, a region that satisfies the above condition, and a region opposite to the first plane 331. In FIG. 17(B), the connecting member 323 is disposed within the region A.

Meanwhile, here, although a configuration is described in which the connecting member 323 electrically connects the first plane 331 and the conductor element 322, a configuration is also present in which the connecting member 323 does not electrically connect the first plane 331 and the conductor element 322, but electrically connects the second plane 311 and the conductor element 322. In addition, a configuration is also present in which the connecting member 323 is not provided. Such configurations will be described later.

FIG. 19(B) is a plan view illustrating the D layer 340 of the interconnect substrate 300 shown in FIGS. 17(A) and 17(B). The D layer 340 is located between the C layer 330 and the E layer 350. On such a D layer 340, at least one or more conductor elements 342 (second conductors) are disposed in a conductor element disposition region 341 (first region, or region shown by the hatching in the drawing) which is a region less than a quarter of the wavelength at a frequency of noise desired to be suppressed, from a position opposite to the end of the first plane 331. Meanwhile, the conductor element disposition region 341 is a region that satisfies the above condition, and may be a region opposite to the first plane 331. The "noise desired to be suppressed" is, for example, noise propagated from the electronic element 361 through the connecting member 362 to the first plane 331.

Here, the conductor element 342 is an insular conductor. The planar shape of the conductor element 342 is not particularly limited, but the conductor element may be formed in a triangular shape, a pentagonal shape, and other polygonal shapes, in addition to a quadrangular shape shown, and may be formed in a circular shape, an elliptical shape and the like. In addition, the number of conductor elements 342 is not particularly limited, but a plurality of conductor elements may be provided. Meanwhile, a plurality of conductor elements are provided, the conductor elements 342 may be repeatedly, for example, periodically arranged at a predetermined distance. A region in the D layer 340 in which the conductor element 342 is not arranged is formed of an insulator, and is insulated from the connecting member 343.

The conductor element 342 is electrically connected to the first plane 331 through the connecting member 343. When the interconnect substrate 300 is seen in a plan view, the connecting member 343 is disposed in a region less than a quarter of the wavelength at a frequency of the noise desired to be suppressed from a position opposite to the end of the first plane 331, for example, a region that satisfies the above condition, and a region opposite to the first plane 331. In FIG. 17(B), the connecting member 343 is disposed within the region A.

Meanwhile, here, although a configuration is described in which the connecting member 343 electrically connects the first plane 331 and the conductor element 342, a configuration is also present in which the connecting member 343 does not electrically connect the first plane 331 and the conductor element 342, but electrically connects the second plane 351 and the conductor element 342. In addition, a configuration is also present in which the connecting member 343 is not provided. Such configurations will be described later.

Figure 20:
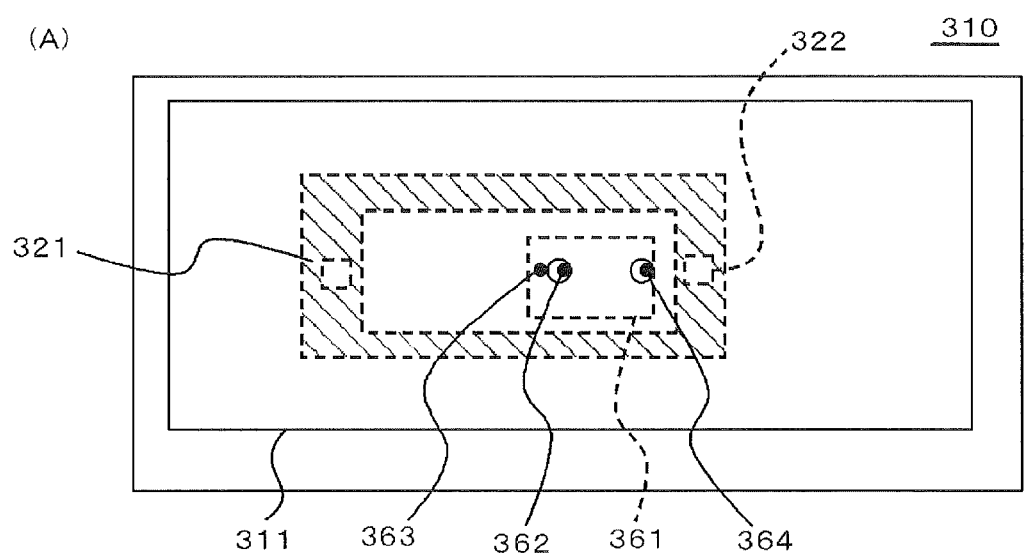
FIG. 20 is a diagram illustrating an example of an A layer and an E layer of the third embodiment.
Figure 20:
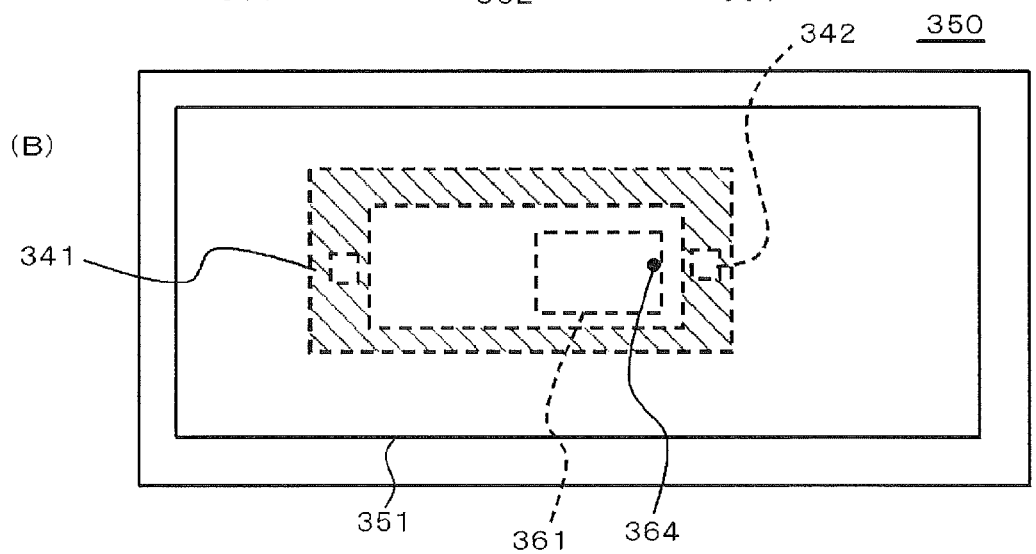
Figure 21:
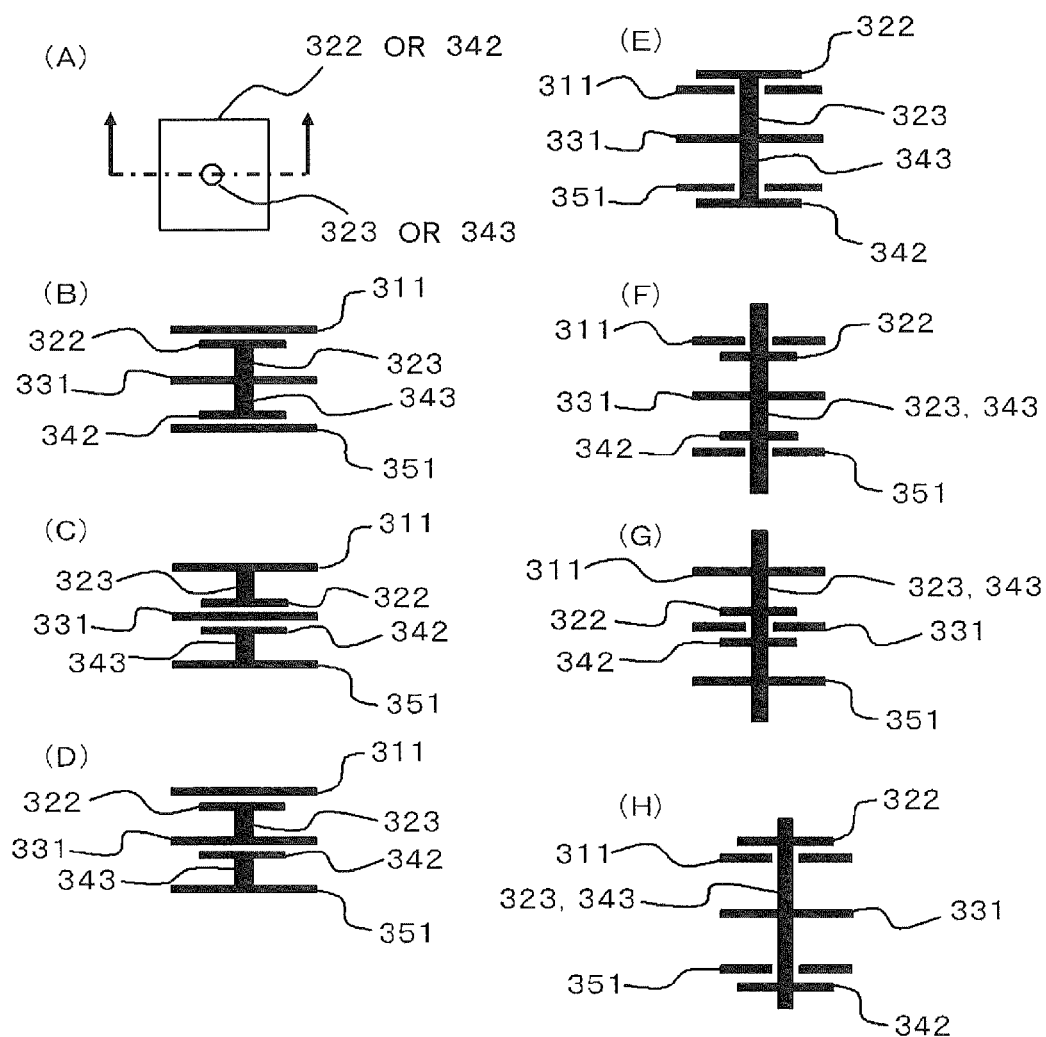
FIG. 21 is a diagram illustrating shapes and positions of a conductor element, a first conductor, a second conductor and a connecting member which are used in the third embodiment.

FIG. 20(A) is a diagram illustrating the A layer 310 of the interconnect substrate 300 shown in FIGS. 17(A) and 17(B). The second plane 311 (third conductor) is a sheet-like conductor, is located on the A layer 310 (second layer) which is a layer located above the C layer 330, and extends to a region opposite to the conductor element disposition region 321. That is, the second plane 311 and the conductor element 322 are opposite to each other through an insulator layer.

The second plane 311 is a power plane or a ground plane. That is, when the first plane 331 is a power plane, the second plane 311 is a ground plane. When the first plane 331 is a ground plane, the second plane 311 is a power plane.

The connecting member 362 passes through an opening provided in the second plane 311, and electrically connects the electronic element 361 and the first plane 331. That is, the connecting member 362 is insulated from the second plane 311. In addition, the connecting member 363 electrically connects the electronic element 361 and the second plane 311. Meanwhile, a region in the A layer 310 in which the second plane 311 is not formed may be an insulator, may be a conductor, and may be a mixture thereof.

FIG. 20(B) is a diagram illustrating the E layer 350 of the interconnect substrate 300 shown in FIGS. 17(A) and 17(B). The second plane 351 (third conductor) is a sheet-like conductor, is located on the E layer 350 (second layer) which is a layer located below the C layer 330, and extends to a region opposite to the conductor element disposition region 341. That is, the second plane 351 and the conductor element 322 are opposite to each other through an insulator layer.

The second plane 351 is a power plane or a ground plane. That is, when the first plane 331 is a power plane, the second plane 351 is a ground plane. When the first plane 331 is a ground plane, the second plane 351 is a power plane.

The connecting member 364 passes through an opening provided in the first plane 331 in a state of non-contact with the first plane 331, and electrically connects the electronic element 361 and the second plane 351. That is, the connecting member 364 is insulated from the first plane 331. Meanwhile, a region in the E layer 350 in which the second plane 351 is not formed may be an insulator, may be a conductor, and may be a mixture thereof.

Here, in the interconnect substrate 300 of the embodiment, a problem can occur in that noise propagated from the electronic element 361 through the connecting member 362 to the first plane 331 leaks to space by the first plane 331 operating similarly to a patch antenna.

However, the interconnect substrate 300 of the embodiment is configured to be capable of solving the above-mentioned problem.

That is, in the interconnect substrate 300 of the embodiment, the above-mentioned configuration is adopted, and thus a unit cell of an EBG structure is formed by the conductor element 322, the first plane 331, the second plane 311, and the connecting member 323. In addition, a unit cell of an EBG structure is formed by the conductor element 342, the first plane 331, the second plane 351, and the connecting member 343. It is possible to suppress noise propagated by the above-mentioned first plane 331 operating similarly to a patch antenna, using the EBG structure in which at least one of the unit cells is present. Meanwhile, in each of the above-mentioned EBG structures, the frequency of noise generated by the electronic element 361 is preferably included in a band gap zone. In addition, the unit cell of the ERG structure formed by the interconnect substrate 300 of the embodiment has a structure including the connecting member 323, but is not necessarily limited thereto. That is, in the interconnect substrate 300, a connecting member may not necessarily be formed in an intermediate layer between the first plane 331 and the second plane 311 or an intermediate layer between the first plane 331 and the second plane 351. The unit cells of various EBG structures which are capable of being applied to the interconnect substrate 300 will be described later.

The term "unit cell" herein means a minimum unit forming an EBG structure the interconnect substrate 300 includes at least one unit cell in each of the conductor element disposition regions 321 and 341, so that noise leakage is suppressed by preventing the end of the first plane 331 from having a node of a high-frequency current and an antinode of a voltage and preventing the end thereof from operating similarly to a patch antenna.

Meanwhile, it is possible to set a desired band gap zone by adjusting the distance between the conductor element 322 and the first plane 331, the distance between the conductor element 342 and the first plane 331, the distance between the conductor element 322 and the second plane 311, the distance between the conductor element 322 and the second plane 351, the thicknesses of the connecting members 323 and 343, the mutual distance between the conductor elements 322, the mutual distance between the conductor elements 342, and the like.

Here, the shapes and the positions of the conductor elements 322 and 342, the connecting members 323 and 343, the first plane 331, and the second planes 311 and 351 which are shown in FIGS. 17 to 20 are an example, and it is possible to adopt various configurations in a range in which an EBG structure can be formed.

FIGS. 21 to 27 are diagrams illustrating shapes and positions of the conductor elements 322 and 342, the connecting members 323 and 343, the first plane 331, and the second planes 311 and 351. Meanwhile, FIGS. 21 to 27 are enlarged views illustrating the periphery of the single conductor element 322 or the single conductor element 342. Each of the structures illustrated in FIGS. 21 to 27 forms a single or a plurality of unit cells, and the interconnect substrate 300 includes any of these unit cells or a plurality of combinations thereof.

FIG. 21(A) is a top view illustrating an example of the conductor elements 322 and 342. The conductor elements 322 and 342 shown herein are quadrangular, and are electrically connected to the connecting members 323 and 343. FIGS. 21(B) to 21(H) are cross-sectional views illustrating chief parts of the interconnect substrate 300 including the conductor elements 322 and 342 shown in FIG. 21(A).

In FIG. 21(B), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 and the connecting member 343 electrically connected to the conductor element 342 are electrically connected to the first plane 331, and have the same configurations as described with reference to FIGS. 17 to 20.

In FIG. 21(C), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the second plane 311, and the connecting member 343 electrically connected to the conductor element 342 is electrically connected to the second plane 351.

In FIG. 21(D), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the first plane 331, and the connecting member 343 electrically connected to the conductor element 342 is electrically connected to the second plane 351.

In FIG. 21(E), the B layer 320 on which the conductor element 322 is formed, the A layer 310 (second layer) on which the second plane 311 is formed, the C layer 330 (first layer) on which the first plane 331 is formed, the E layer 350 (second layer) on which the second plane 351 is formed, and the D layer 340 on which the conductor element 342 is formed are laminated in this order. The connecting member 323 electrically connected to the conductor element 322 passes through the opening provided in the second plane 311 in a state of non-contact with the second plane 311, and is electrically connected to the first plane 331. That is, the connecting member 323 is insulated from the second plane 311. In addition, the connecting member 343 electrically connected to the conductor element 342 passes through an opening provided in the second plane 351 in a state of non-contact with the second plane 351, and is electrically connected to the first plane 331. That is, the connecting member 343 is insulated from the second plane 351.

Meanwhile, the connecting members 323 and 343 pass through the insides of the openings provided in the second planes 311 and 351 described herein, and the conductor elements 322 and 342 are disposed so as to be opposite to the openings. Therefore, it is possible to substantially prevent noise from leaking from the opening.

Each of the structures of FIGS. 21(B) to 21(E) mentioned above is a so-called mushroom-type EBG structure. Specifically, the connecting members 323 and 343 are equivalent to a shank of a mushroom, and form an inductance. In FIGS. 21(B) and 21(E), the conductor elements 322 and 342 are equivalent to a head portion of the mushroom, and form a capacitance between the conductor elements and the second planes 311 and 351 opposite thereto. In addition, in FIG. 21(C), the conductor elements 322 and 342 are equivalent to the head portion of the mushroom, and form a capacitance between the conductor elements and the first plane 331 opposite thereto. In addition, in FIG. 21(D), the conductor elements 322 and 342 are equivalent to the head portion of the mushroom, and form a capacitance between the conductor elements between the conductor elements, and the second plane 311 and the first plane 331 opposite thereto.

The mushroom-type EBG structure can be represented by an equivalent circuit in which a parallel plate is shunted using a series resonant circuit formed of the above-mentioned capacitance and the above-mentioned inductance, the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance. However, even when the conductor elements 322 and 342 are not brought close to the opposite plane, the essential effect of the invention is not influenced at all.

FIGS. 21(F) to 21(H) are an example in which the connecting members 323 and 343 are through vias.

In FIG. 21(F), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

In FIG. 21(G), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the opening provided in the first plane 331 in a state of non-contact with the first plane 331, and are electrically connected to the second planes 311 and 351. That is, the through vias (connecting members 323 and 343) are insulated from the first plane 331.

In FIG. 21(H), the B layer 320 on which the conductor element 322 is formed, the A layer 310 (second layer) on which the second plane 311 is formed, the C layer 330 (first layer) on which the first plane 331 is formed, the E layer 350 (second layer) on which the second plane 351 is formed, and the D layer 340 on which the conductor element 342 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

The structures of FIGS. 21(F) to 21(H) mentioned above are an example in which the mushroom-type EBG structure is deformed. Specifically, the through vias (connecting members 323 and 343) are equivalent to a shank of the mushroom, and form an inductance. In FIGS. 21(F) and 21(H), the conductor elements 322 and 342 are equivalent to the head portion of the mushroom, and form a capacitance between the conductor elements and the second planes 311 and 351 opposite thereto. In addition, in FIG. 21(G), the conductor elements 322 and 342 are equivalent to the head portion of the mushroom, and form a capacitance between the conductor elements and the first plane 311 opposite thereto.

Similarly to the mushroom-type EBG structure, each of the structures of FIGS. 21(F) to 21(H) can also be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance. However, even when the conductor elements 322 and 342 are not brought close to the opposite plane, the essential effect of the invention is not influenced at all.

The configurations shown in FIGS. 21(F) to 21(H) are adopted, thereby allowing an EBG structure to be manufactured in the conductor element disposition regions 321 and 341 using a through via. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used.

FIG. 22(A) is a top view illustrating an example of the conductor elements 322 and 342. Each of the conductor elements 322 and 342 shown herein is a spiral transmission line formed in the planar direction, and is configured such that one end thereof is connected to the connecting member 323 or 343 and the other end thereof is formed as an open end. FIGS. 22(B) to 22(H) are cross-sectional views illustrating chief parts of the interconnect substrate 300 including the conductor elements 322 and 342 shown in FIG. 22(A).

In FIG. 22(B), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 and the connecting member 343 electrically connected to the conductor element 342 are electrically connected to the first plane 331.

In FIG. 22(C), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the second plane 311, and the connecting member 343 electrically connected to the conductor element 342 is electrically connected to the second plane 351.

In FIG. 22(D), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the first plane 331, and the connecting member 343 electrically connected to the conductor element 342 is electrically connected to the second plane 351.

In FIG. 22(E), the B layer 320 on which the conductor element 322 is formed, the A layer 310 (second layer) on which the second plane 311 is formed, the C layer 330 (first layer) on which the first plane 331 is formed, the E layer 350 (second layer) on which the second plane 351 is formed, and the D layer 340 on which the conductor element 342 is formed are laminated in this order. The connecting member 323 electrically connected to the conductor element 322 passes through the opening provided in the second plane 311 in a state of non-contact with the second plane 311, and is electrically connected to the first plane 331. That is, the connecting member 323 is insulated from the second plane 311. In addition, the connecting member 343 electrically connected to the conductor element 342 passes through the opening provided in the second plane 351 in a state of non-contact with the second plane 351, and is electrically connected to the first plane 331. That is, the connecting member 343 is insulated from the second plane 351.

Each of the structures shown in FIGS. 22(B) to 22(E) is an open stub-type EBG structure in which a microstrip line formed including the conductor element 322 or 342 functions as an open stub. Specifically, the connecting members 323 and 343 form an inductance. In FIGS. 22(B) and 22(E), the conductor elements 322 and 342 are electrically coupled to the second plane 311 or 351 opposite thereto, to thereby form a microstrip line using the second plane 311 or 351 as a return path. In addition, in FIG. 22(C), the conductor elements 322 and 342 are electrically coupled to first plane 331 opposite thereto, to thereby form a microstrip line using the first plane 331 as a return path. In addition, in FIG. 22(D), the conductor element 322 is electrically coupled to the second plane 311 opposite thereto, to thereby form a microstrip line using the second plane 311 as a return path, and the conductor element 342 is electrically coupled to the first plane 331 opposite thereto, to thereby form a microstrip line using the first plane 331 as a return path. One end of the above-mentioned microstrip line is formed as an open end, and functions as an open stub.

The open stub-type EBG structure can be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the conductor element 322 or 342.

In addition, it is preferable that the conductor element 322 or 342 forming a microstrip line and the plane opposite thereto be close to each other. This is because as the distance the conductor element and the plane opposite thereto decreases, the characteristic impedance of the above-mentioned microstrip line becomes lower, and thus the band gap zone can be widened. However, even when the conductor elements 322 and 342 are not brought close to the opposite plane, the essential effect of the invention is not influenced at all.

FIGS. 22(F) to 22(H) are an example in which the connecting members 323 and 343 are through vias.

In FIG. 22(F), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the H layer 350 (second layer) on which the second plane 351 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

In FIG. 22(G), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the opening provided in the first plane 331 in a state of non-contact with the first plane 331, and are electrically connected to the second planes 311 and 351. That is, the through vias (connecting members 323 and 343) are insulated from the first plane 331.

In FIG. 22(H), the B layer 320 on which the conductor element 322 is formed, the A layer 310 (second layer) on which the second plane 311 is formed, the C layer 330 (first layer) on which the first plane 331 is formed, the E layer 350 (second layer) on which the second plane 351 is formed, and the D layer 340 on which the conductor element 342 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

Each of the structures shown in FIGS. 22(F) to 22(H) is a modified example of the open stub-type EBG structure in which a microstrip line formed including the conductor element 322 or 342 functions as an open stub. Specifically, the through vias (connecting members 323 and 343) form an inductance. In FIGS. 22(F) and 22(H), the conductor elements 322 and 342 are electrically coupled to the second planes 311 and 351 opposite thereto, to thereby form a microstrip line using the second planes 311 and 351 as a return path. In addition, in FIG. 22(G), the conductor elements 322 and 342 are electrically coupled to the first plane 331 opposite thereto, to thereby form a microstrip line using the first plane 331 as a return path. One end of the above-mentioned microstrip line is formed as an open end, and functions as an open stub.

Similarly to the open stub-type EBG structure, each of the structures shown in FIGS. 22(F) to 22(H) can also be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the conductor element 322 or 342.

In addition, it is preferable that the conductor element 322 and 342 forming a microstrip line and the plane opposite thereto be close to each other. This is because as the distance the conductor element and the plane opposite thereto decreases, the characteristic impedance of the microstrip line becomes lower, and thus the band gap zone can be widened. However, even when the conductor elements 322 and 342 are not brought close to the opposite plane, the essential effect of the invention is not influenced at all.

The configurations shown in FIGS. 22(F) to 22(H) are adopted, thereby allowing an EBG structure to be manufactured in the first and second parallel plates using a through via. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used.

Figure 22:
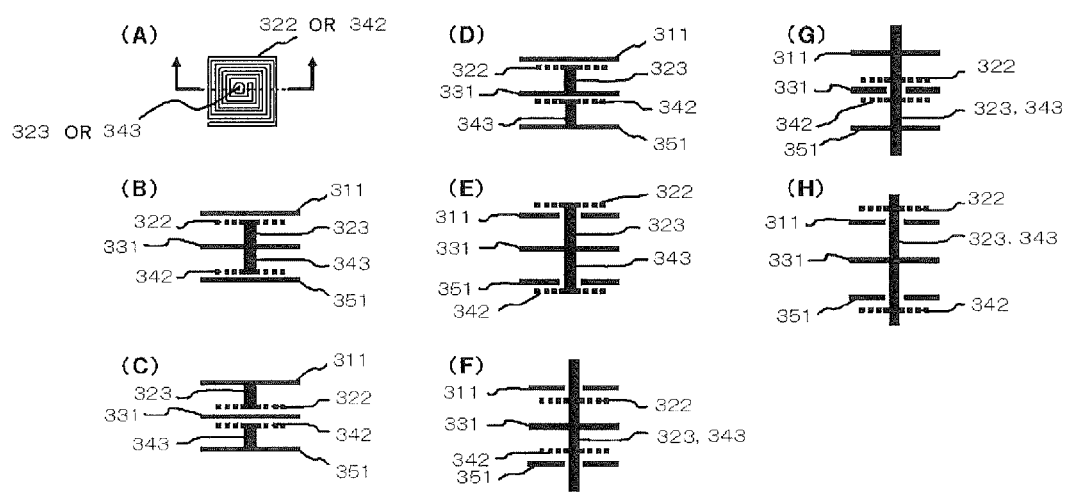
FIG. 22 is a diagram illustrating shapes and positions of the conductor element, the first conductor, the second conductor and the connecting member which are used in the third embodiment.

Meanwhile, in FIG. 22, the above-mentioned transmission line is spiral in shape, but the shape thereof may not be limited thereto. For example, the transmission line may be linear in shape, and may be meandering in shape.

FIG. 23(A) is a top view illustrating an example of the conductor elements 322 and 342. The conductor elements 322 and 342 shown herein are quadrangular conductors, and have an opening. A spiral inductor of which one end is electrically connected to the conductor elements 322 and 342 in a deep spot of the opening and the other end is connected to the connecting member 323 or 343 is formed in the inside of the opening. FIGS. 23(B) to 23(H) are cross-sectional views illustrating chief parts of the interconnect substrate 300 including the conductor elements 322 and 342 shown in FIG. 23(A).

In FIG. 23(B), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 and the connecting member 343 electrically connected to the conductor element 342 are electrically connected to the first plane 331.

In FIG. 23(C), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the second plane 311, and the connecting member 343 electrically connected to the conductor element 342 is electrically connected to the second plane 351.

In FIG. 23(D), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the first plane 331, and the connecting member 343 electrically connected to the conductor element 342 is electrically connected to the second plane 351.

In FIG. 23(E), the B layer 320 on which the conductor element 322 is formed, the A layer 310 (second layer) on which the second plane 311 is formed, the C layer 330 (first layer) on which the first plane 331 is formed, the E layer 350 (second layer) on which the second plane 351 is formed, and the D layer 340 on which the conductor element 342 is formed are laminated in this order. The connecting member 323 electrically connected to the conductor element 322 passes through the opening provided in the second plane 311 in a state of non-contact with the second plane 311, and is electrically connected to the first plane 331. That is, the connecting member 323 is insulated from the second plane 311. In addition, the connecting member 343 electrically connected to the conductor element 342 passes through the opening provided in the second plane 351 in a state of non-contact with the second plane 351, and is electrically connected to the first plane 331. That is, the connecting member 343 is insulated from the second plane 351.

Each of the structures of FIGS. 23(B) to 23(E) mentioned above is an increased inductance-type EBG structure in which the inductance is increased by providing an inductor in a head portion of a mushroom, on a mushroom-type EBG structure basis. Specifically, in FIGS. 23(B) and 23(E), the conductor elements 322 and 342 are equivalent to a head portion of a mushroom, and form a capacitance between the conductor elements and the second planes 311 and 351 opposite thereto. In addition, in FIG. 23(C), the conductor elements 322 and 342 are equivalent to the head portion of the mushroom, and form a capacitance the conductor elements and the first plane 331 opposite thereto. In addition, in FIG. 23(D), the conductor elements 322 and 342 are equivalent to of the head portion of the mushroom, and form a capacitance between the conductor elements and the second plane 311 or the first plane 331 opposite thereto. On the other hand, the connecting members 323 and 343 are equivalent to a shank of the mushroom, and form an inductance together with the inductor provided in the conductor elements 322 and 342.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance or by increasing the length of the above-mentioned inductor to increase the inductance. However, even when the conductor elements 322 and 342 are not brought close to the opposite plane, the essential effect of the invention is not influenced at all.

FIGS. 23(F) to 23(H) are an example in which the connecting members 323 and 343 are through vias.

In FIG. 23(F), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

In FIG. 23(G), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the opening provided in the first plane 331 in a state of non-contact with the first plane 331, and are electrically connected to the second planes 311 and 351. That is, the through vias (connecting members 323 and 343) are insulated from the first plane 331.

In FIG. 23(H), the B layer 320 on which the conductor element 322 is formed, the A layer 310 (second layer) on which the second plane 311 is formed, the C layer 330 (first layer) on which the first plane 331 is formed, the B layer 350 (second layer) on which the second plane 351 is formed, and the D layer 340 on which the conductor element 342 is formed are laminated in this order. The through vias (connecting members 323 and 343) pass through the openings provided in the second planes 311 and 351 in a state of non-contact with the second planes 311 and 351, and are electrically connected to the first plane 331. That is, the through vias (connecting members 323 and 343) are insulated from the second planes 311 and 351.

Each of the structures of FIGS. 23(F) to 23(H) mentioned above is a modified example of the increased inductance-type EBG structure in which the inductance is increase by providing an inductor in a head portion of a mushroom. Specifically, the through vias (connecting members 323 and 343) are equivalent to the shank of the mushroom, and form an inductance. In FIGS. 23(F) and 23(H), the conductor elements 322 and 342 are equivalent to the head portion of the mushroom, and form a capacitance between the conductor elements and the second planes 311 and 351 opposite thereto. In addition, in FIG. 23(G), the conductor elements 322 and 342 are equivalent to the head portion of the mushroom, and form a capacitance between the conductor elements and the first plane 331 opposite thereto.

Similarly to the mushroom-type EBG structure, each of the structures of FIGS. 23(F) to 23(H) can also be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance or by increasing the length of the above-mentioned inductor to increase the inductance. However, even when the conductor elements 322 and 342 are not brought close to the opposite plane, the essential effect of the invention is not influenced at all.

Figure 23:
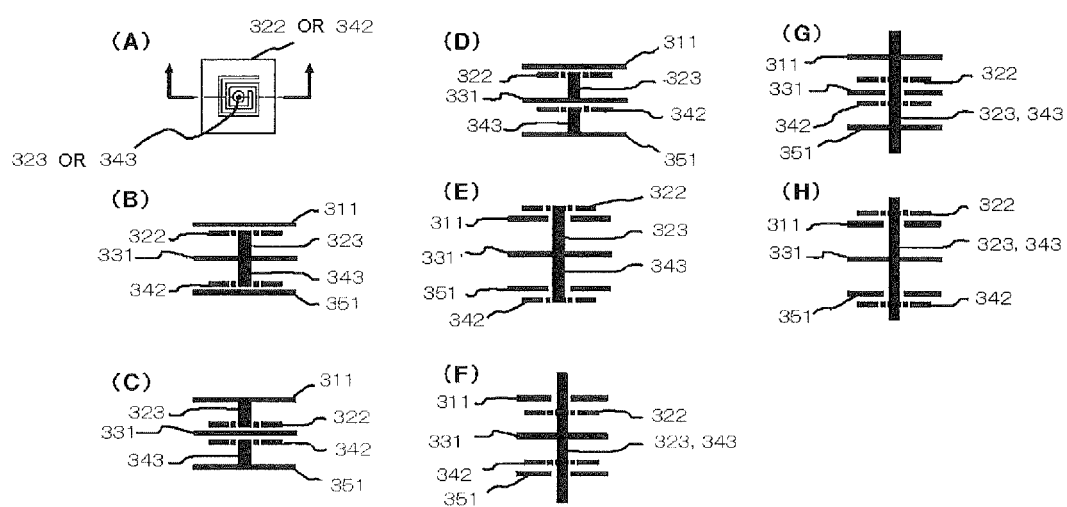
FIG. 23 is a diagram illustrating shapes and positions of the conductor element, the first conductor, the second conductor and the connecting member which are used in the third embodiment.
Figure 24:
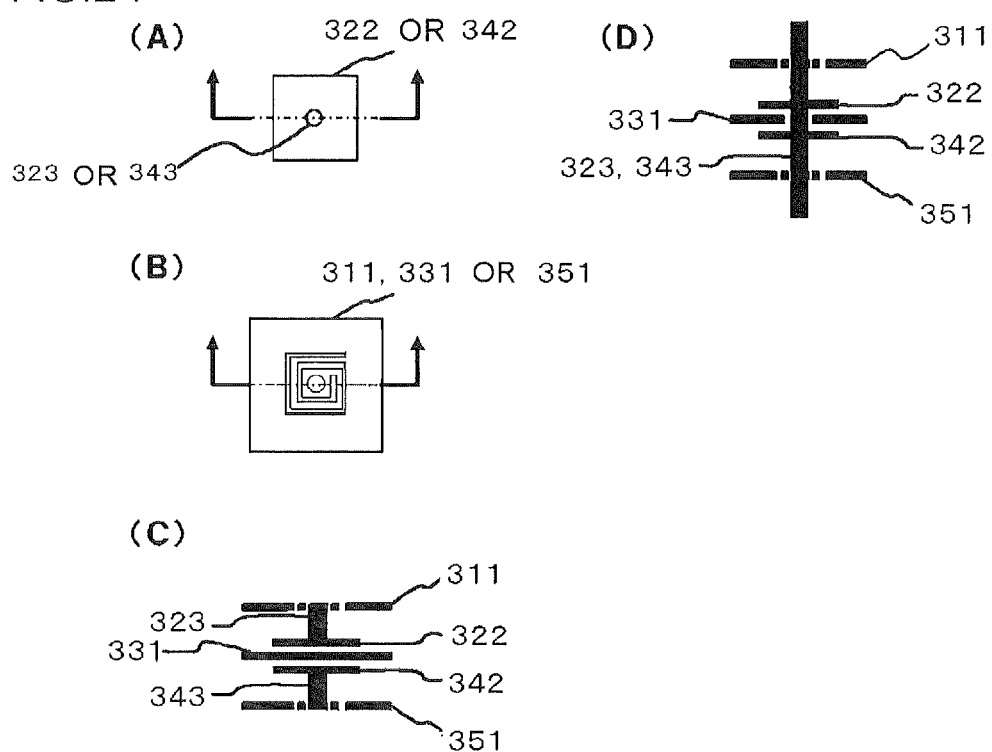
FIG. 24 is a diagram illustrating shapes and positions of the conductor element, the first conductor, the second conductor and the connecting member which are used in the third embodiment.

The configurations shown in FIGS. 23(F) to 23(H) are adopted, thereby allowing an EBG structure to be manufactured in the first and second parallel plates using a through via. Normally, a non-through via is laminated after a via is processed for each layer, whereas a through via is manufactured by forming a through-hole using a drill after all the layers are laminated and plating the internal surface of the through-hole. Therefore, it is possible to further reduce manufacturing costs than in a case where the non-through via is used. Meanwhile, in FIG. 23, the above-mentioned inductor is spiral in shape, but the shape thereof may not be limited thereto. For example, the inductor may be linear in shape, and may be meandering in shape.

When the examples shown in FIGS. 22(B) to 22(D) and FIGS. 23(B) to 23(D) are used, an opening through which the connecting member 323 or 343 passes is not required to be provided in the first plane 331 and the second planes 311 and 351. Meanwhile, when regions opposite to the conductor elements 322 and 342 are formed to be imperforate in the second planes 311 and 351 and the first plane 331, it is preferable because noise does not leak from the regions. Here, even when a hole (opening) having a diameter sufficiently smaller the noise wavelength of a frequency band to be suppressed is empty in the regions opposite to the conductor elements 322 and 342, the hole may be deemed to be imperforate.

In addition, when the examples shown in FIGS. 22(E) to 22(H) and FIGS. 23(E) to 23(H) are used, any of the first plane 331 and the second planes 311 and 351 has an opening through which the connecting member 323 or 343 passes. However, when the opening has a diameter sufficiently smaller than the noise wavelength of a frequency band to be suppressed, noise to be suppressed does not leak, and thus it is preferable to form the opening in this manner.

FIG. 24(A) is a top view illustrating an example of the conductor elements 322 and 342. The conductor elements 322 and 342 shown herein are quadrangular, and are electrically connected to the connecting member 323 or 343. In addition, FIG. 24(B) is a top view illustrating a portion of an example (region opposite to the conductor element 322 or 342) of the first plane 331 or the second plane 311 or 351 which is electrically connected to the conductor element 322 or 342 through the connecting member 323 or 343. The first plane 331 or the second plane 311 or 351 shown in FIG. 24(B) has an opening, and a spiral inductor of which one end is electrically connected to the first plane 331 or the second plane 311 or 351 in a deep spot of the opening and the other end is electrically connected to the connecting member 323 or 343 is formed in the inside of the opening. FIGS. 24(C) and 24(D) are cross-sectional views illustrating chief parts of the interconnect substrate 300 including the conductor elements 322 and 342, and the first plane 331 or the second plane 311 or 351 shown in FIGS. 24(A) and 24(B).

In FIG. 24(C), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The connecting member 323 electrically connected to the conductor element 322 is electrically connected to the second plane 311, and the connecting member 343 electrically connected to the conductor element 342 is electrically connected to the second plane 351.

The structure of FIG. 24(C) is an increased inductance-type EBG structure in which the inductance is increased by providing an inductor in the second planes 311 and 351, on a mushroom-type EBG structure basis. Specifically, in FIG. 24(C), the conductor elements 322 and 342 are equivalent to a head portion of a mushroom, and form a capacitance between the conductor elements and the second planes 331 and 351 opposite thereto. The connecting members 323 and 343 are equivalent to a shank of the mushroom, and form an inductance together with the inductor provided in the second planes 311 and 351.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance or by increasing the length of the above-mentioned inductor to increase the inductance. However, even when the conductor elements 322 and 342 are not brought close to the opposite plane, the essential effect of the invention is not influenced at all.

FIG. 24(D) is an example in which the connecting members 323 and 343 are through vias.

In FIG. 24(D), the A layer 310 (second layer) on which the second plane 311 is formed, the B layer 320 on which the conductor element 322 is formed, the C layer 330 (first layer) on which the first plane 331 is formed, the D layer 340 on which the conductor element 342 is formed, and the E layer 350 (second layer) on which the second plane 351 is formed are laminated in this order. The through vias (connecting members 323 and 343) pass through the opening provided in the first plane 331 in a state of non-contact with the first plane 331, and are electrically connected to the second planes 311 and 351. That is, the through vias (connecting members 323 and 343) are insulated from the first plane 331.

The structure of FIG. 24(D) is a modified example of the increased inductance-type EBG structure in which the inductance is increased by providing an inductor in the second planes 311 and 351, on a mushroom-type EBG structure basis. Specifically, in FIG. 24(D), the conductor elements 322 and 342 are equivalent to the head portion of the mushroom, and form a capacitance between the conductor elements and the second plane 331 opposite thereto. The connecting members 323 and 343 are equivalent to a shank of the mushroom, and form an inductance together with the inductor provided in the second planes 311 and 351.

The increased inductance-type EBG structure can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing the conductor elements 322 and 342 close to each of the opposite planes forming a capacitance to increase the capacitance or by increasing the length of the above-mentioned inductor to increase the inductance. However, even when the conductor elements 322 and 342 are not brought close to the opposite plane, the essential effect of the invention is not influenced at all. Meanwhile, in FIG. 24, the inductor is spiral in shape, but the shape thereof may not be limited thereto. For example, the inductor may be linear in shape, and may be meandering in shape.

Figure 25:
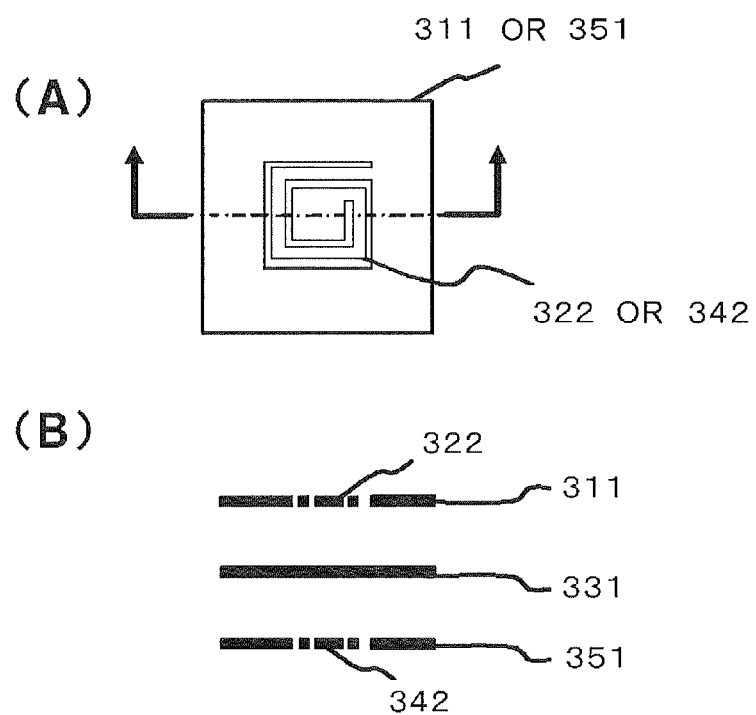
FIG. 25 is a diagram illustrating shapes and positions of the conductor element, the first conductor and the second conductor which are used in the third embodiment.
Figure 26:
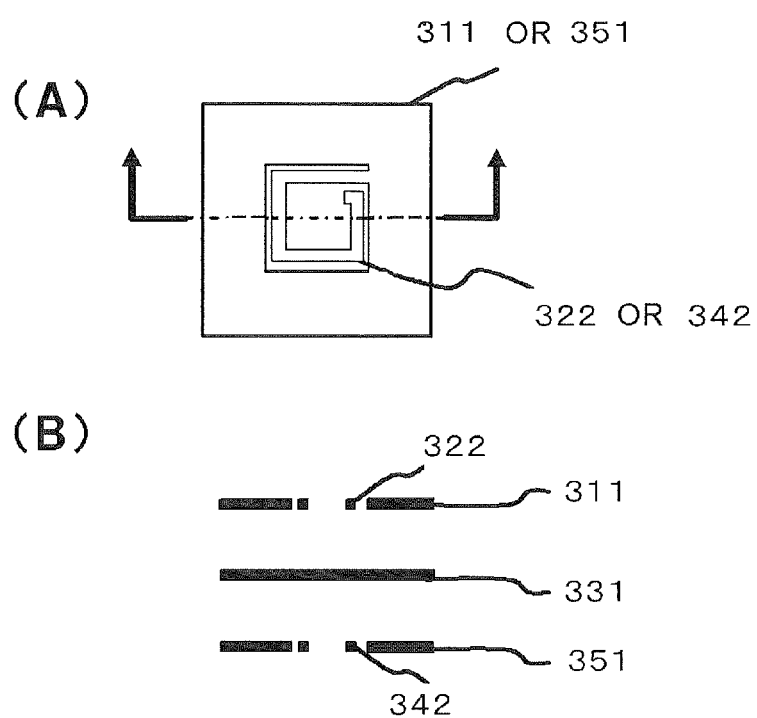
FIG. 26 is a diagram illustrating shapes and positions of the conductor element, the first conductor and the second conductor which are used in the third embodiment.
Figure 27:
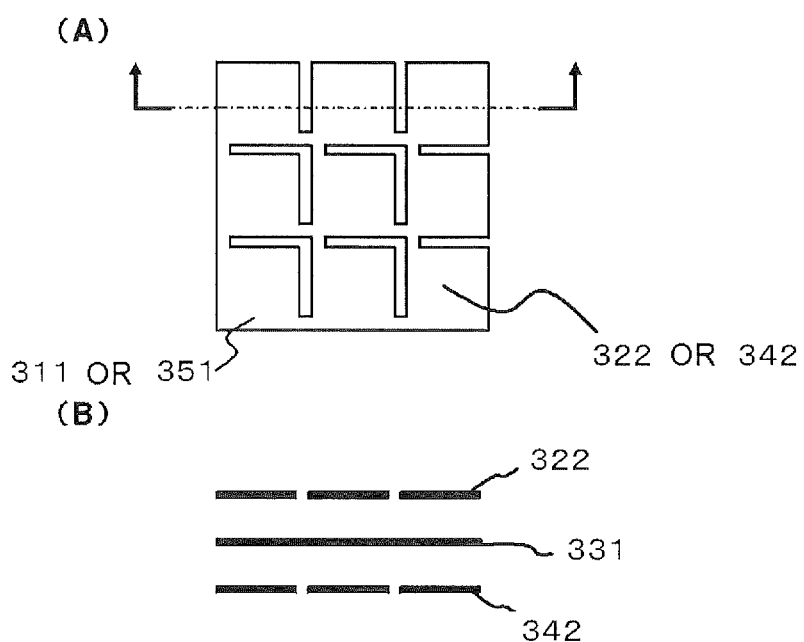
FIG. 27 is a diagram illustrating shapes and positions of the conductor element, the first conductor and the second conductor which are used in the third embodiment.

FIGS. 25 to 27 described subsequently are an example in which the conductor elements 322 and 342 are arranged in the C layer 330 (first layer) having the first plane 331, or the A layer 310 (second layer) having the second plane 311 and the E layer 350 (second layer) having the second plane 351. That is, the above drawings are an example in which the conductor elements 322 and 342, and the first plane 331 or the second planes 311 and 351 are formed on the same layer. In such an example, it is possible to reduce the thickness of the interconnect substrate 300 than in the above-mentioned example. Meanwhile, in FIGS. 25 to 27, the connecting members 323 and 343 are not required. In addition, FIGS. 25 to 27 show configurations in contrast to an upper layer with and a lower layer from the first plane 331, but the configurations are not necessarily in contrast.

FIG. 25(A) is a top view illustrating an example of the conductor element 322 or 342 formed in inside of the second plane 311 or 351. The second planes 311 and 351 have an opening. The conductor elements 322 and 342 is constituted by an insular conductor (quadrangular conductor located at the center of the second plane 311 or 351 in FIG. 25(A)) formed in the inside of the opening and an inductor that connects the insular conductor and the second plane 311 or 351. Meanwhile, in FIG. 25(A), the inductor spirally surrounds the insular conductor, but the shape thereof may not be limited thereto. For example, the inductor may be linear-shaped, and may be meandering-shaped. In addition, the shape, the size and the like of the insular conductor (quadrangular conductor located at the center of the second plane 311 or 351 in FIG. 25(A)) formed in the inside of the opening are not particularly limited, but can be variously set.

FIG. 25(B) is a cross-sectional view illustrating chief parts of the interconnect substrate 300 including the conductor element 322 or 342 and the second plane 311 or 351 shown in FIG. 25(A). In FIG. 25(B) the conductor elements 322 and 342 formed in the inside of the second planes 311 and 351 are opposite to the first plane 331. Meanwhile, a configuration is also possible in which the first plane 331 and the second planes 311 and 351 shown in FIG. 25(B) are reversed, and the conductor elements 322 and 342 formed in the inside of the first plane 331 is opposite to the second planes 311 and 351.

The structure of FIG. 25 mentioned above is a modified example of the mushroom-type EBG structure. The head portion and the shank of the mushroom are provided in the opening of the first plane 331 or the second planes 311 and 351, so that the number of layers required for an EBG structure is reduced, and thus the connecting members 323 and 343 are not required. Specifically, in FIG. 25(B), the insular conductor (quadrangular conductor at the located of the center second planes 311 and 351 in FIG. 25(A)) constituting the conductor elements 322 and 342 formed in the insides of the second planes 311 and 351 is equivalent to the head portion of the mushroom, and forms a capacitance between the conductor and the first planes 331 opposite thereto. In addition, the inductor constituting the conductor elements 322 and 342 is equivalent to the shank of the mushroom, and forms an inductance. On the other hand, when the first plane 331 and the second planes 311 and 351 shown in FIG. 25(B) are reversed, and the conductor elements 322 and 342 formed in the inside of the first plane 331 are opposite to the second planes 311 and 351, the insular conductor constituting the conductor elements 322 and 342 formed in the inside of the first plane 331 is equivalent to the head portion of the mushroom, and forms a capacitance between the conductor and the second planes 311 and 351 opposite thereto. In addition, the inductor constituting the conductor elements 322 and 342 is equivalent to the shank of the mushroom, and forms an inductance.

Similarly to the mushroom-type EBG structure, the structure of FIG. 25 can be represented by an equivalent circuit in which a parallel plate is shunted using a series resonant circuit formed of the above-mentioned capacitance and the above-mentioned inductance, and the resonance frequency of the above-mentioned series resonant circuit provides a center frequency of the band gap. Therefore, the band gap zone can be shifted to a lower frequency by bringing a layer, on which the above-mentioned insular conductor (quadrangular conductor located at the center of the second planes 311 and 351 in FIG. 25(A)) is disposed, close to the opposite plane forming a capacitance to increase the capacitance. However, even when the layer in which the above-mentioned insular conductor is disposed is not brought close to the power plane opposite thereto, the essential effect of the invention is not influenced at all.

FIG. 26(A) is a top view illustrating an example of the conductor element 322 or 342 formed in the inside of the second plane 311 or 351. The second planes 311 and 351 have an opening. Each of the conductor elements 322 and 342 is a transmission line of which one end is electrically connected to the second plane 311 or 351 in a deep spot of the opening and the other end is an open end which is not electrically connected to the second plane 311 or 351. Meanwhile, in FIG. 26(A), the shape of the transmission line is spiral, but the shape thereof may not be limited thereto. For example, the transmission line may be linear-shaped, and may be meandering-shaped.

FIG. 26(B) is a cross-sectional view illustrating chief parts of the interconnect substrate 300 including the conductor elements 322 and 342 and the second planes 311 and 351 shown in FIG. 26(A). In FIG. 26(B), the conductor elements 322 and 342 formed in the insides of the second planes 311 and 351 are opposite to the first plane 331. Meanwhile, a configuration is also possible in which the first plane 331 and the second planes 311 and 351 shown in FIG. 26(B) are reversed, and the conductor elements 322 and 342 formed in the inside of the first plane 331 are opposite to the second planes 311 and 351.

The structure of FIG. 26 mentioned above is a modified example of the open stub-type EBG structure. The transmission line functioning as an open stub is provided in the opening of one of the first plane 331 or the second planes 311 and 351, so that the number of layers required for an EBG structure is reduced, and thus the connecting members 323 and 343 are not required. Specifically, in FIG. 26(B), the conductor elements 322 and 342 formed in the insides of the second planes 311 and 351 are electrically coupled to the first plane 331 opposite thereto, to thereby form a microstrip line using the first plane 331 as a return path. One end of the above-mentioned microstrip line is formed as an open end, and functions as an open stub. On the other hand, when the first plane 331 and the second planes 311 and 351 shown in FIG. 26(B) are reversed, and the conductor elements 322 and 342 formed in the inside of the first plane 331 are opposite to the second planes 311 and 351, the conductor elements 322 and 342 formed in the inside of the first plane 331 are electrically coupled to the second planes 311 and 351 opposite thereto, to thereby form a microstrip line using the second planes 311 and 351 as a return path. One end of the above-mentioned microstrip line is formed as an open end, and functions as an open stub.

The open stub-type EBG structure can be represented by an equivalent circuit in which a parallel plate is shunted using a series resonant circuit formed of the above-mentioned open stub and the above-mentioned inductance, and the resonance frequency of the above-mentioned series resonant circuit provides a center frequency of the band gap. Therefore, the band gap zone can be shifted to a lower frequency by increasing the length of the open stub formed including the conductor elements 322 and 342. In addition, it is preferable that the conductor elements 322 and 342 forming a microstrip line and the power plane opposite thereto be close to each other. This is because as the distance between the conductor element and the power plane decreases, the characteristic impedance of the above-mentioned microstrip line becomes lower, and thus the band gap zone can be widened. However, even when the conductor elements 322 and 342 are not brought close to the power plane opposite thereto, the essential effect of the invention is not influenced at all.

FIG. 27(A) is a top view illustrating an example of the conductor element 322 or 342 formed in the inside of the second plane 311 or 351. The conductor elements 322 and 342 are a plurality of insular conductors formed in the second plane 311 or 351, and adjacent insular conductors are electrically connected to each other.

FIG. 27(B) is across-sectional view illustrating chief parts of the interconnect substrate 300 including the conductor elements 322 and 342 and the second planes 311 and 351 shown in FIG. 27(A).

In FIG. 27(B), the conductor elements 322 and 342 formed in the insides of the second planes 311 and 351 (not shown) are opposite to the first plane 331. Meanwhile, a configuration is also possible in which the first plane 331 and the second planes 311 and 351 (not shown) shown in FIG. 27(B) are reversed, and the conductor elements 322 and 342 formed in the inside of the first plane 331 are opposite to the second planes 311 and 351.

In the structure of FIG. 27 mentioned above, the adjacent insular conductors (conductor elements 322 and 342) are electrically coupled to each other to thereby form a capacitance, and a connection portion that electrically connects these insular conductors (conductor elements 322 and 342) to each other forms an inductance to thereby function as an EBG structure. In the EBG structure shown in FIG. 27, the resonance frequency of a parallel resonant circuit formed of the above-mentioned capacitance and the above-mentioned inductance provides a center frequency of the band gap zone. Therefore, the band gap zone can be shifted to a lower frequency by decreasing the distance between the above-mentioned insular conductors (conductor elements 322 and 342), and increasing a capacitance or increasing the length of the above-mentioned connection portion to thereby increase an inductance.

FIG. 28(A) is a top view illustrating an example of the conductor element 322. The conductor element 322 shown herein is a spiral transmission line formed in the planar direction, and is electrically coupled to the first plane 331 to thereby form a microstrip line using the first plane 331 as a return path. In addition, one end of the conductor element 322 is electrically connected to the connecting member 323, and the other end is formed as an open end.

FIG. 28(B) is a cross-sectional view illustrating chief parts of the interconnect substrate 300 including the conductor element 322 shown in FIG. 28(A), and is a cross-sectional view taken along the section line B-B in FIG. 28(A).

In FIG. 28(B), the connecting member 323 is formed as a through via. The through via (connecting member 323) is electrically connected to the conductor element 322 and the second planes 311 and 351, and passes through the opening provided in the first plane 331 in a state of non-contact with the first plane 331. That is, the first plane 331 and the connecting member 323 are insulated from each other.

In the configuration shown in FIGS. 28(A) and 28(B), the conductor element 322, the first plane 331, and the second planes 311 and 351 constitute an open stub-type EBG structure, suppress noise propagating through the first plane 331, and suppress noise propagating through the second planes 311 and 351. In such a case, since the conductor element 342 in the configuration shown i FIG. 22(G) can be eliminated, the degree of freedom of a layout of an interconnect in the D layer 340 is improved. In addition, when an interconnect is not required to be formed in the D layer 340, the thickness of the D layer 340 can be reduced, and thus it is possible to reduce the thickness of the interconnect substrate 300. Meanwhile, in FIG. 28(B), although an example is shown in which a conductor element is disposed in the B layer 320, it is also possible to naturally consider a configuration in which a conductor element is disposed in the D layer 340 rather than the B layer 320. In this case, it is also possible to realize completely the same operations and effects.

Figure 28:
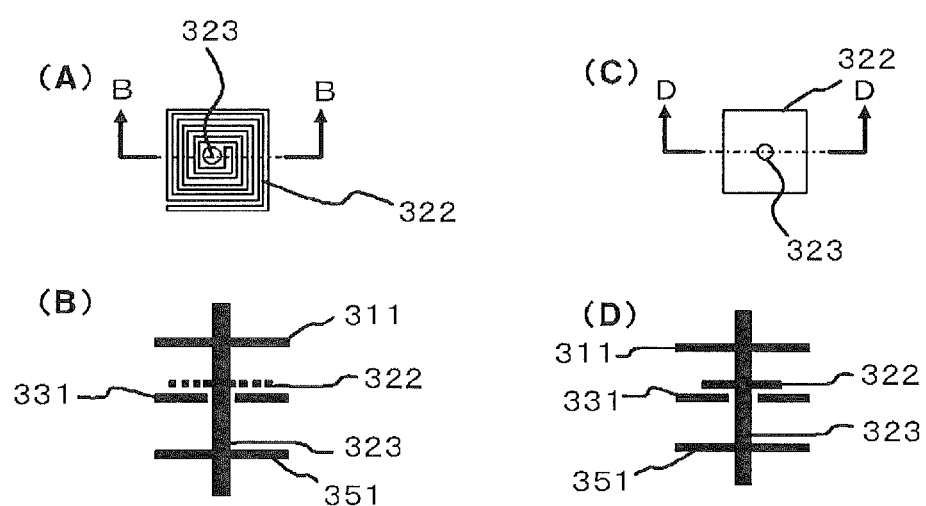
FIG. 28 is a diagram illustrating shapes and positions of the conductor element, the first conductor, the second conductor and the connecting member which are used in the third embodiment.

In the structure shown in FIGS. 28(A) and 28(B), completely similarly to another open stub-type EBG structure, the band gap zone can also be shifted to a lower frequency by increasing the length of the open stub formed including the conductor element 322. In addition, it is preferable that the conductor element 322 forming a microstrip line and the plane opposite thereto be close to each other. This is because as the distance between the conductor element 322 and the plane opposite thereto decreases, the characteristic impedance of the above-mentioned microstrip line becomes lower, and thus the band gap zone can be widened. However, even when the conductor element 322 is not brought close to the plane opposite thereto, the essential effect of the invention is not influenced at all. Meanwhile, in FIG. 28, the transmission line is spiral in shape, but the shape thereof may not be limited thereto. For example, the transmission line may be linear in shape, and may be meandering in shape.

FIG. 28(C) is a top view illustrating an example of the conductor element 322. The conductor element 322 shown herein is quadrangular, and is electrically connected to the connecting member 323.

FIG. 28(D) is a cross-sectional view illustrating chief parts of the interconnect substrate 300 including the conductor element 322 shown in FIG. 28(C), and is a cross-sectional view taken along the section line D-D in FIG. 28(C).

In FIG. 28(D), the connecting member 323 is formed as a through via. The through via (connecting member 323) is electrically connected to the conductor element 322 and the second planes 311 and 351, and passes through an opening provided in the first plane 331 in a state of non-contact with the first plane 331. That is, the first plane 331 and the connecting member 323 are insulated from each other.

In the structure shown in FIGS. 28(C) and 28(D), the conductor element 322, the first plane 331, and the second planes 311 and 351 constitute a mushroom-type EBG structure, suppress noise propagating through the first plane 331, and suppress noise propagating through the second planes 311 and 351. In such a case, since the conductor element 342 in the configuration shown in FIG. 21(G) can be eliminated, the degree of freedom of a layout of an interconnect in the D layer 340 is improved. In addition, when an interconnect is not required to be formed in the D layer 340, the thickness of the D layer 340 can be reduced, and thus it is possible to reduce the thickness of the interconnect substrate 300. Meanwhile, in FIG. 28(D), although an example is shown in which a conductor element is disposed in the B layer 320, it is also possible to naturally consider a configuration in which a conductor element is disposed in the D layer 340 rather than the B layer 320. In this case, it is also possible to realize completely the same operations and effects.

Here, an effect of the third embodiment will be described. In the embodiment, the second plane 311 is present in an upper layer of the first plane 331 separated in an island shape, and the second plane 351 is also present in a lower layer thereof, to form a power plane or a ground plane. Using the above-mentioned configuration, in the interconnect substrate 300, the same operations and effects as those of the interconnect substrate 100 of the first embodiment is realized.

Moreover, in an electronic device in which the electronic element 361 is mounted to a predetermined position of the interconnect substrate 300, it is also possible to realize the same operations and effects. A unit that mounts the electronic element 361 to a predetermined position of the interconnect substrate 300 of the embodiment can be realized according to the related art.

Fourth Embodiment

Figure 29:
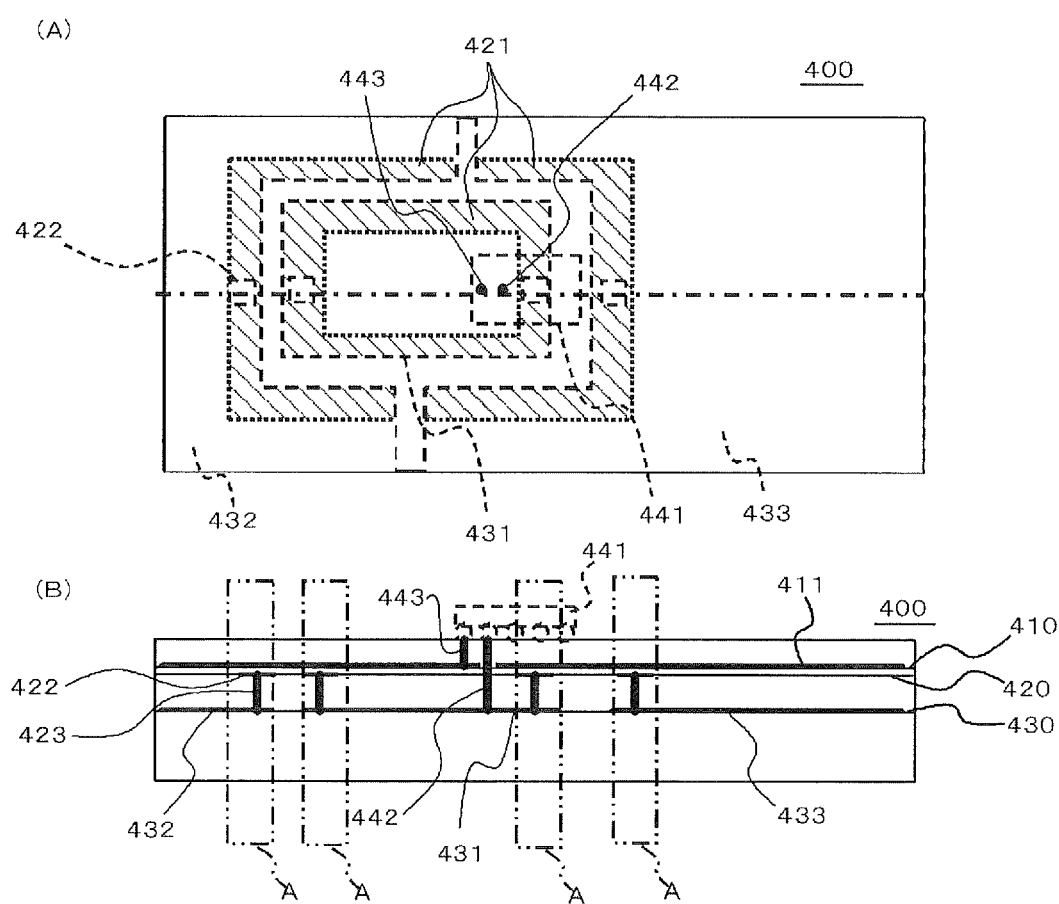
FIG. 29 is an example illustrating a top view and a cross-sectional view of an interconnect substrate according to a fourth embodiment.

FIGS. 29(A) and 29(B) are an example illustrating a top view and a cross-sectional view of an interconnect substrate 400 of a fourth embodiment. More specifically, FIG. 29(A) is a top view of the interconnect substrate 400, and FIG. 29(B) is a cross-sectional view of the interconnect substrate 400 in the long-dashed short-dashed line shown in FIG. 29(A).

The interconnect substrate 400 shown in FIGS. 29(A) and 29(B) is a multilayer substrate including at least an A layer 410, a B layer 420, and a C layer 430 which are opposite to each other. The A layer 410 has a second plane 411. The B layer 420 has a conductor element 422. The C layer 430 has a first plane 431. The conductor element 422 and the first plane 431 are electrically connected to each other through a connecting member 423. Meanwhile, the interconnect substrate 400 may include layers other than the above-mentioned three layers. For example, an insulating layer may be located between each of the layers. Furthermore, a signal line layer in which only a signal line is buried in an insulating layer may be located between each of the layers.

In addition, the interconnect substrate 400 may include a hole, a via and the like, which are not shown, in other ways in the range consistent with the configuration of the invention. Further, in anyone or more layers of the A layer 410, the B layer 420, and the C layer 430 mentioned above, a signal line may be arranged in the range consistent with the configuration of the invention.

Meanwhile, in FIGS. 29(A) and 29(B), an electronic element 441 is shown by the broken line. This means that the electronic element 441 is not mounted. That is, a region intended to mount the electronic element 441 is determined on the surface of the interconnect substrate 400. The interconnect substrate 400 includes a connecting member 442 that electrically connects the electronic element 441 and the first plane 431 which is located on the C layer 430. Further, the interconnect substrate 400 includes a connecting member 443 that connects the electronic element 441 and the second plane 411.

In addition these connecting members, the interconnect substrate 400 may include a connecting member that connects the electronic element 441 and a plane or a line. For example, the member is a connecting member or the like for electrically connection to a signal line or the like. Here, the electronic element 441 is assumed to be a device such as an LSI. The number of electronic elements 441 mounted to the interconnect substrate 400 may be one, or may be two or more.

Figure 30:
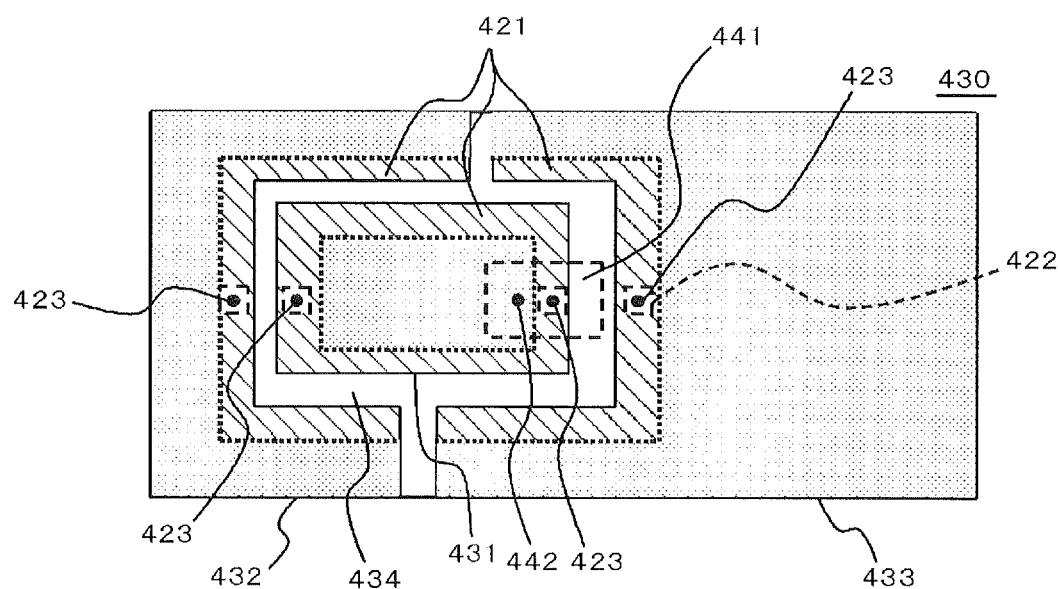
FIG. 30 is a diagram illustrating a C layer of the fourth embodiment.

FIG. 30 is a plan view illustrating the C layer 430 of the interconnect substrate 400 shown in FIGS. 29(A) and 29(B). First planes 431, 432 and 433 (first conductors) made of a conductive material are disposed in the C layer 430 (first layer) at a distance 434. In this inside, the first plane 431 is separated in an island shape. An insulator is filled in the distance 434, and the first planes 431, 432 and 433 are insulated from each other.

The first plane 431 has a connection point which is electrically connected to the connecting member 442 and the connecting member 423. The first planes 431, 432 and 433 are power planes or ground planes. Meanwhile, the shape, the size and the like of the first planes 431, 432 and 433 are not particularly limited, but can be variously set according to the related art.

Figure 31:
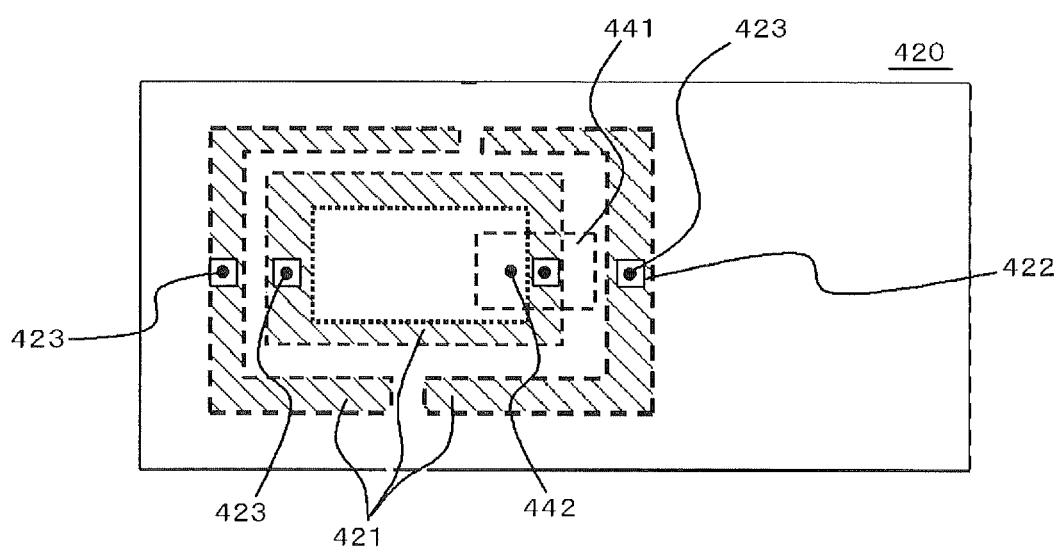
FIG. 31 is a diagram illustrating a B layer of the fourth embodiment.

FIG. 31 is a plan view illustrating the B layer 420 of the interconnect substrate 400 shown in FIGS. 29(A) and 29(B). The B layer 420 is located between the C layer 430 and the A layer 410. On such a B layer 420, at least one or more conductor elements 422 (second conductors) are disposed in conductor element disposition regions 421 (first regions, or regions shown by the hatching in the drawing) which are regions less than a quarter of the wavelength occurring at a frequency of noise desired to be suppressed, from positions which are opposite to the end of the first plane 431 separated in an island shape and the ends of the first planes 432 and 433 opposite to the end of the first plane 431. Meanwhile, the conductor element disposition regions 421 are regions that satisfy the above condition, and may be regions opposite to the first planes 431, 432 and 433. The "noise desired to be suppressed" is, for example, noise propagated from the electronic element 441 through the connecting member 442 to the first plane 431.

Here, the conductor element 422 is an insular conductor. The planar shape of the conductor element 422 is not particularly limited, but the conductor element may be formed in a triangular shape, a pentagonal shape, and other polygonal shapes, in addition to a quadrangular shape shown, and may be formed in a circular shape, an elliptical shape and the like. In addition, the number of conductor elements 422 is not particularly limited, but a plurality of conductor elements may be provided. Meanwhile, a plurality of conductor elements are provided, the conductor elements 422 may be repeatedly, for example, periodically arranged at a predetermined distance. A region in the B layer 420 in which the conductor element 422 is not arranged is formed of an insulator, and is insulated from the connecting member 442.

The conductor element 422 is electrically connected to the first plane 431, 432 or 433 through the connecting member 423. When the interconnect substrate 400 is seen in a plan view, the connecting member 423 is disposed in a region less than a quarter of the wavelength occurring at a frequency of noise desired to be suppressed from a position opposite to the end of each of the first planes 431, 432 and 433, for example, a region that satisfies the above condition, and a region opposite to the first plane 431. In FIG. 29(B), the connecting member 423 is disposed within the region A.

Meanwhile, here, although a configuration is described in which the connecting member 423 is electrically connected to the first plane 431, 432 or 433, a configuration is also present in which the connecting member 423 does not electrically connect the first plane 431, 432 or 433 and the conductor element 422, but electrically connects the second plane 411 and the conductor element 422. In addition, a configuration is also present in which the connecting member 423 is not provided. Such configurations will be described later.

Figure 32:
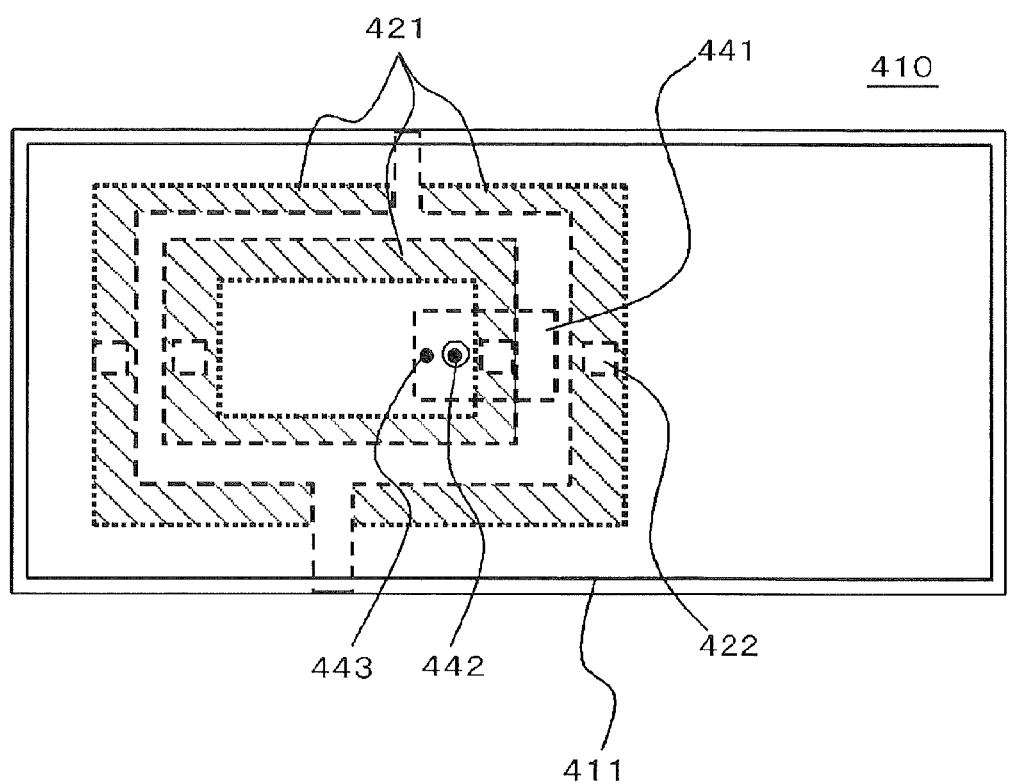
FIG. 32 is a diagram illustrating an A layer of the fourth embodiment.

FIG. 32 is a plan view illustrating the A layer 410 of the interconnect substrate 400 shown in FIGS. 29(A) and 29(B). The second plane 411 (third conductor) is a sheet-like conductor, is located on the A layer 410 (second layer) which is a layer located above the C layer 430, and extends to a region opposite to the conductor element disposition regions 421. That is, the second plane 411 and the conductor element 422 are opposite to each other through an insulator layer.

The second plane 411 is a power plane or a ground plane. That is, when the first planes 431, 432 and 433 are power planes, the second plane 411 is a ground plane. When the first planes 431, 432 and 433 are ground planes, the second plane 411 is a power plane.

The connecting member 442 passes through an opening provided in the second plane 411, and electrically connects the electronic element 441 and the first plane 431. That is, the connecting member 442 is insulated from the second plane 411.

Meanwhile, a region in the A layer 410 in which the second plane 411 is not formed may be an insulator, may be a conductor, and may be a mixture thereof.

Here, in the interconnect substrate 400 of the embodiment, a problem can occur in that noise propagated from the electronic element 441 through the connecting member 442 to the first plane 431 leaks to space by a slit facing the first plane 431 operating similarly to a patch antenna.

The interconnect substrate 400 of the embodiment is configured to be capable of solving the above-mentioned problem.

That is, in the interconnect substrate 400 of the embodiment, the above-mentioned configuration is adopted, and thus a unit cell of an EBG structure is formed by the conductor element 422, the first plane 431, 432 or 433, the second plane 411, and the connecting member 423 electrically connected to the first plane 431, 432 or 433. It is possible to suppress noise propagated by the above-mentioned slit operating similarly to a slot antenna, using the EBG structure in which at least one of the unit cells is present. Meanwhile, in each of the above-mentioned EBG structures, the frequency of noise generated by the electronic element 441 is preferably included in a band gap zone. In addition, the unit cell of the EBG structure formed by the interconnect substrate 400 of the embodiment has a structure including the connecting member 423, but is not necessarily limited thereto. That is, in the interconnect substrate 400, a connecting member may not necessarily be formed in an intermediate layer between the first planes 431, 432 and 433 and the second plane 411. The unit cells of various EBG structures which are capable of being applied to the interconnect substrate 400 have the same structure as that in the first embodiment.

Here, an effect of the fourth embodiment will be described. Noise propagated from the electronic element 441 through the connecting member 442 to the first plane 431 separated in an island shape resonates in a region interposed between the first plane 431 and the second plane 411. At this time, the end of the first plane 431 has an antinode of a voltage, so that an electric field is generated in a slit between the above-mentioned end and the end of the first plane 432 or 433 opposite thereto, and the above-mentioned slit operates similarly to a slot antenna, to thereby cause noise to leak to space. Consequently, in the embodiment, an EBG structure formed of at least one or more unit cells in each of the planes is disposed in the above-mentioned conductor element disposition regions 421. Thereby, noise propagated from the electronic element 441 through the connecting member 442 to the first plane 431 separated in an island shape has a node of a voltage because the first planes 431 and 432 or 433 and the second plane 411 are short-circuited in a place where the EBG structure is disposed, due to series resonance caused by the EBG structure at the frequency of noise desired to be suppressed. The place, having a node of a voltage, in which the EBG structure is disposed is present in the conductor element disposition regions 421. That is, the above-mentioned place is present in a place less than a quarter of the wavelength from the ends of the first planes 431 and 432 or 433. For this reason, since the ends of the first planes 431 and 432 or 433 do not have an antinode of a voltage, the leakage of noise to space is suppressed.

In addition, the band gap zone of the EBG structure in the embodiment includes a frequency of noise generated from the electronic element 441, and thus it is possible to obtain a higher noise suppressing effect.

Meanwhile, in an electronic device in which the electronic element 441 is mounted to a predetermined position of the interconnect substrate 400, it is also possible to realize the same operations and effects. A unit that mounts the electronic element 441 to a predetermined position of the interconnect substrate 400 of the embodiment can be realized according to the related art.

Fifth Embodiment

Figure 33:
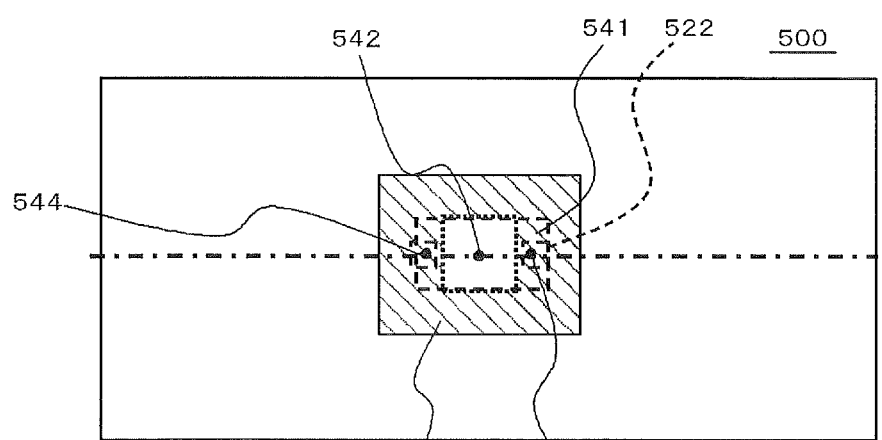
FIG. 33 is an example illustrating a top view and a cross-sectional view of an interconnect substrate according to a fifth embodiment.
Figure 33:
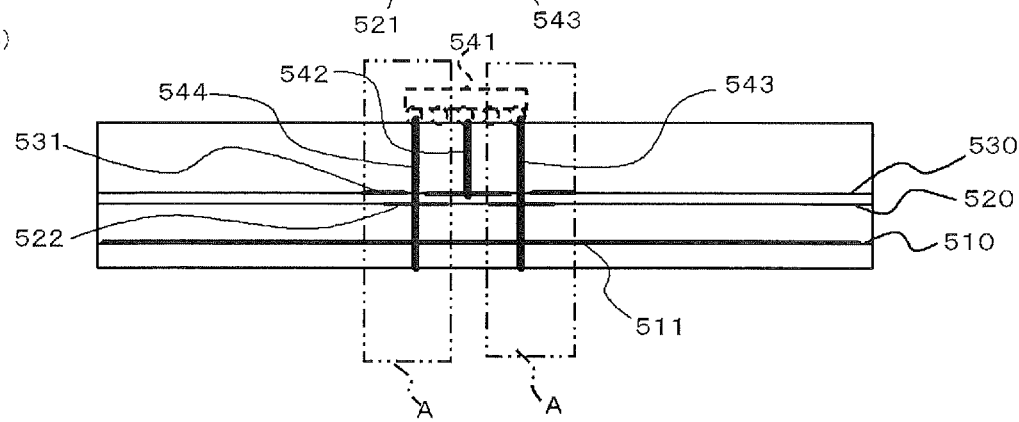

FIGS. 33(A) and 33(B) are an example illustrating a top view and a cross-sectional view of an interconnect substrate 500 of fifth embodiment. More specifically, FIG. 33(A) is a top view of the interconnect substrate 500, and FIG. 33(B) is a cross-sectional view of the interconnect substrate 500 in the long-dashed short-dashed line shown in FIG. 33(A).

The interconnect substrate 500 shown in FIGS. 33(A) and 33(B) is a multilayer substrate including at least an A layer 510, a B layer 520, and a C layer 530 which are opposite to each other. The A layer 510 has a second plane 511. The B layer 520 has a conductor element 522. The C layer 530 has a first plane 531. The conductor element 522 and the second plane 511 are electrically connected to each other through through-vias which are connecting members 543 and 544. Meanwhile, the interconnect substrate 500 may include layers other than the above-mentioned three layers. For example, an insulating layer may be located between each of the layers. Furthermore, a signal line layer in which only a signal line is buried in an insulating layer may be located between each of the layers. In addition, the connecting members 543 and 544 may be non-through vias.

In addition, the interconnect substrate 500 may include a hole, a via and the like, which are not shown, in other ways in the range consistent with the configuration of the invention. Further, in any one or more layers of the A layer 510, the B layer 520, and the C layer 530 mentioned above, a signal line may be arranged in the range consistent with the configuration of the invention.

Meanwhile, in FIGS. 33(A) and 33(B), although a configuration is shown in which the connecting members 543 and 544 electrically connect the second plane 511 and the conductor element 522, a configuration is also present in which the connecting members 543 and 544 do not electrically connect the second plane 511 and the conductor element 522, but electrically connect the first plane 531 and the conductor element 522.

Meanwhile, the interconnect substrate 500 is the same as that of the interconnect substrate 200 obtained by applying an example in which the second plane 211 or the first plane 231 and the conductor element 222 are connected to each other through the connecting member 223, among the examples described in the second embodiment, specifically any of the configurations described with reference to FIGS. 5, 6, 7, 8 and the like, except that the connecting members 543 and 544 that connect an electronic element 541 and the second plane 511 are included in a conductor element disposition region 521 (first region, or region shown by the hatching in the drawing), and that the connecting members 543 and 544 also function as connecting members that connect the conductor element 522 and the second plane 531. Therefore, a detailed description thereof will not be repeated.

According to the embodiment, it is possible to realize the same operations and effects as those of the above-mentioned embodiment.

Moreover, in an electronic device in which the electronic element 541 is mounted to a predetermined position of the interconnect substrate 500, it is also possible to realize the same operations and effects. A unit that mounts the electronic element 541 to a predetermined position of the interconnect substrate 500 of the embodiment can be realized according to the related art.

As described above, although the embodiments of the invention have been set forth with reference to the accompanying drawings, they are merely illustrative of the invention, and various configurations other than stated above can be adopted.

For example, in a third embodiment, an electronic element is mounted onto the surface of an interconnect substrate. However, the interconnect substrate of the invention may include a mounting region, to which an electronic element is mounted, in an intermediate layer between layers (different second layers) in which the second plane (third conductor) and the third plane (third conductor) are formed. However, in this case, the interconnect substrate is manufactured using a build-up process, and thus the connecting member is preferably a non-through laser via.

According to the above-mentioned description, it is also possible to perform the following invention.

<First Invention>

The interconnect substrate according to any one of claims 1 to 4, wherein the laminated body includes a plurality of the second layers, and
the second conductors are arranged in at least one of the second layers.

<Second Invention>

The interconnect substrate according to the first invention, wherein the second conductor is an insular conductor formed in the inside of an opening included in the third conductor, and the second conductor is electrically connected to the third conductor through an inductor.

<Third Invention>

The interconnect substrate according to the first invention, wherein the second conductor is located in the inside of the opening included in the third conductor, is a transmission line of which one end is electrically connected to the third conductor and the other end is an open end which is not in contact with the third conductor, and is opposite to the first conductor, and a region of the first conductor which is opposite to the second conductor is imperforate.

<Fourth Invention>

The interconnect substrate according to any one of claims 1 to 9 or any one of the first invention to the third invention, wherein the laminated body further includes a third connecting member buried in the laminated body in order to electrically connect the electronic element and the third conductor, and
when the interconnect substrate is seen in a plan view, at least one of the first connecting member and the third connecting member is located at a region less than a quarter of a wavelength occurring at a frequency of noise propagated from the electronic element to the first conductor, from an end of the first conductor, and the connecting member is electrically connected to the second conductor.

Meanwhile, the embodiments and the modified examples mentioned above can be naturally combined in the range consistent with the contents thereof.

The application claims priority from Japanese Patent Application No. 2010-192247 filed on Aug. 30, 2010, the content of which is incorporated herein by reference in its entirety.

The invention claimed is:

1. An interconnect substrate comprising a laminated body, including an electric conductor and an insulator, over which an electronic element is disposed,
wherein the laminated body includes
a first layer having at least one first conductor separated in an island shape,
a first connecting member which is buried in the laminated body in order to electrically connect the electronic element and the first conductor,
a second layer having a third conductor which is provided opposite to at least a partial region of the first conductor, and
a second conductor which is provided opposite to at least one of the first conductor and the third conductor with a layer of the insulator interposed therebetween, and
wherein when the laminated body is seen in a plan view, the second conductor is located at a region less than a quarter of a wavelength at a frequency of noise propagated from the electronic element to the first conductor, from an end of the first conductor.

2. The interconnect substrate according to claim 1, wherein the first conductor, the second conductor and the third conductor constitute at least a portion of an electromagnetic band gap structure, and
the electromagnetic band gap structure includes a frequency of noise generated by the electronic element in a band gap zone.

3. The interconnect substrate according to claim 1, wherein a plurality of the first conductors are present in the first layer,
a plurality of the first connecting members are present in order to electrically connect the electronic element and each of at least two first conductors of the plurality of first conductors,
the second conductor is located at each of the regions less than a quarter of the wavelength at the frequency of the noise propagated from the electronic element to the first conductor, from the end of each of the at least two first conductors electrically connected to the first connecting member.

4. The interconnect substrate according to claim 1, wherein a plurality of the first conductors are present in the first layer,
the plurality of first conductors include a first connected conductor which is electrically connected to the first connecting member and a first non-connected conductor which is not electrically connected to the first connecting member, and
the second conductor is located at a region less than a quarter of a wavelength at a frequency of noise propagated from the electronic element to the first connected conductor, from an end of the first connected conductor, and is located at a region less than a quarter of a wavelength at a frequency of noise propagated from the electronic element to the first connected conductor, from an end of the first non-connected conductor opposite to the end of the first connected conductor.

5. The interconnect substrate according to claim 1, further comprising a second connecting member, buried in the laminated body, which electrically connects the second conductor and the first conductor or the third conductor.

6. The interconnect substrate according to claim 5, wherein the laminated body includes any one set of a plurality of the first layers and a plurality of the second layers,
the second conductor is located at at least one intermediate layer interposed between the first layer and the second layer.

7. The interconnect substrate according to claim 5, wherein the laminated body includes the second conductor, the first layer, and the second layer in this order from above or below,
the second connecting member is electrically connected to the third conductor, and passes through an opening provided in the first conductor in a state of non-contact with the first conductor,
the second conductor is opposite to the first conductor, and is electrically connected to the second connecting member passing through the opening provided in the first conductor opposite thereto, and
the number of layers on which the second conductor is formed is equal to the number of first layers.

8. The interconnect substrate according to claim 7, wherein a region of the third conductor which is opposite to the second conductor is imperforate.

9. The interconnect substrate according to claim 5, wherein the laminated body includes the second conductor, the second layer, and the first layer in this order from above or below,
the second connecting member is electrically connected to the first conductor, and passes through an opening provided in the third conductor in a state of non-contact with the third conductor, and
the second conductor is opposite to the third conductor, and is electrically connected to the second connecting member passing through the opening provided in the third conductor opposite thereto.

10. An electronic device comprising:
the interconnect substrate according to claim 1; and
an electronic element, disposed over the laminated body of the interconnect substrate, which is electrically connected to the first conductor through the first connecting member.

11. The interconnect substrate according to claim 2, wherein a plurality of the first conductors are present in the first layer,
a plurality of the first connecting members are present in order to electrically connect the electronic element and each of at least two first conductors of the plurality of first conductors,
the second conductor is located at each of the regions less than a quarter of the wavelength at the frequency of the noise propagated from the electronic element to the first conductor, from the end of each of the at least two first conductors electrically connected to the first connecting member.

12. The interconnect substrate according to claim 2, wherein a plurality of the first conductors are present in the first layer,
the plurality of first conductors include a first connected conductor which is electrically connected to the first connecting member and a first non-connected conductor which is not electrically connected to the first connecting member, and
the second conductor is located at a region less than a quarter of a wavelength at a frequency of noise propagated from the electronic element to the first connected conductor, from an end of the first connected conductor, and is located at a region less than a quarter of a wavelength at a frequency of noise propagated from the electronic element to the first connected conductor, from an end of the first non-connected conductor opposite to the end of the first connected conductor.

13. The interconnect substrate according to claim 3, wherein a plurality of the first conductors are present in the first layer,
the plurality of first conductors include a first connected conductor which is electrically connected to the first connecting member and a first non-connected conductor which is not electrically connected to the first connecting member, and
the second conductor is located at a region less than a quarter of a wavelength at a frequency of noise propagated from the electronic element to the first connected conductor, from an end of the first connected conductor, and is located at a region less than a quarter of a wavelength at a frequency of noise propagated from the electronic element to the first connected conductor, from an end of the first non-connected conductor opposite to the end of the first connected conductor.

14. The interconnect substrate according to claim 2, further comprising a second connecting member, buried in the laminated body, which electrically connects the second conductor and the first conductor or the third conductor.

15. The interconnect substrate according to claim 3, further comprising a second connecting member, buried in the laminated body, which electrically connects the second conductor and the first conductor or the third conductor.

16. The interconnect substrate according to claim 4, further comprising a second connecting member, buried in the laminated body, which electrically connects the second conductor and the first conductor or the third conductor.

17. The interconnect substrate according to claim 6, wherein the laminated body includes the second conductor, the first layer, and the second layer in this order from above or below,
the second connecting member is electrically connected to the third conductor, and passes through an opening provided in the first conductor in a state of non-contact with the first conductor,
the second conductor is opposite to the first conductor, and is electrically connected to the second connecting member passing through the opening provided in the first conductor opposite thereto, and
the number of layers on which the second conductor is formed is equal to the number of first layers.

18. The interconnect substrate according to claim 6, wherein the laminated body includes the second conductor, the second layer, and the first layer in this order from above or below,
the second connecting member is electrically connected to the first conductor, and passes through an opening provided in the third conductor in a state of non-contact with the third conductor, and
the second conductor is opposite to the third conductor, and is electrically connected to the second connecting member passing through the opening provided in the third conductor opposite thereto.

19. An electronic device comprising:
the interconnect substrate according to claim 2; and
an electronic element, disposed over the laminated body of the interconnect substrate, which is electrically connected to the first conductor through the first connecting member.

20. An electronic device comprising:
the interconnect substrate according to claim 3; and
an electronic element, disposed over the laminated body of the interconnect substrate, which is electrically connected to the first conductor through the first connecting member.

* * * * *